(12) United States Patent
Nitta

(10) Patent No.: US 7,808,846 B2
(45) Date of Patent: Oct. 5, 2010

(54) SEMICONDUCTOR MEMORY DEVICE

(75) Inventor: Tadashi Nitta, Kyoto (JP)

(73) Assignee: Panasonic Corporation, Osaka (JP)

( * ) Notice: Subject to any disclaimer, the term of this patent is extended or adjusted under 35 U.S.C. 154(b) by 243 days.

(21) Appl. No.: 12/187,803

(22) Filed: Aug. 7, 2008

(65) Prior Publication Data

US 2009/0040848 A1 Feb. 12, 2009

(30) Foreign Application Priority Data

Aug. 9, 2007 (JP) .............................. 2007-207671

(51) Int. Cl.
*G11C 7/00* (2006.01)

(52) U.S. Cl. ......................... 365/194; 365/233; 365/145

(58) Field of Classification Search ................. 365/194, 365/233, 145, 189.05, 189.04, 189.07, 230.05, 365/185.22, 191, 189.03

See application file for complete search history.

(56) References Cited

U.S. PATENT DOCUMENTS 4,415,984 A 11/1983 Gryger et al.

5,801,562 A 9/1998 Fujii
6,829,316 B1 * 12/2004 Terada et al. ................. 375/355
2007/0058479 A1 * 3/2007 Matsui ........................ 365/233

FOREIGN PATENT DOCUMENTS

| JP | 8-102729 | 4/1996 |
|----|----------|--------|
| JP | 3146117 | 1/2001 |
| JP | 2001-154907 | 6/2001 |

* cited by examiner

*Primary Examiner*—Dang T Nguyen
(74) *Attorney, Agent, or Firm*—McDermott Will & Emery LLP

(57) ABSTRACT

A semiconductor memory device to/from which a data signal is input/output in synchronism with a clock, including: an input signal delaying circuit for delaying an input signal to output the delayed input signal; a delayed clock generation circuit for delaying an input clock by different amounts of delay time to thereby generate a plurality of delayed clocks; a plurality of delayed input signal holding circuits for holding the delayed input signal on the plurality of delayed clocks, respectively; an input signal latch timing determination circuit for outputting a determination signal indicating a timing at which to latch the delayed input signal, based on a plurality of held signals held by the delayed input signal holding circuits; and a held signal selector circuit for integrating the plurality of held signals into a single signal.

18 Claims, 17 Drawing Sheets

"SEMICONDUCTOR MEMORY DEVICE

BACKGROUND OF THE INVENTION

1. Field of the Invention

The present invention relates to a semiconductor memory device to/from which stored data is input/output in synchronism with a clock signal.

2. Description of the Background Art

FIG. 18 is a schematic block diagram showing a synchronous semiconductor memory device to/from which signals are input/output in synchronism with a clock, and an information processing device for controlling the semiconductor memory device.

A semiconductor memory device 600 and an information processing device 601 are connected to each other by an input signal 609, a clock 610, and an output data signal 612. The semiconductor memory device 600 includes an input signal latching circuit 602 and a memory core 603, wherein the input signal latching circuit 602 and the memory core 603 are connected to each other by a latched signal 604. The memory core 603 includes a control circuit, a power supply circuit, a decoder circuit and a read circuit for operating the memory core 603.

The input signal latching circuit 602 latches the received input signal 609 in synchronism with the clock 610, and outputs the latched signal 604.

FIGS. 19A to 19C are timing diagrams each showing an input signal latching operation with a circuit configuration as shown in FIG. 18.

FIG. 19A is a timing diagram showing an input signal latching operation in a case where the input signal transitions before the rising edge of the clock.

FIG. 19B is a timing diagram showing an input signal latching operation in a case where the input signal timing is delayed with respect to that shown in FIG. 19A, whereby the input signal transitions after the rising edge of the clock, due to variations such as those in the voltage conditions of the device, those in the temperature conditions of the device, and those in the wire delay between the information processing device and the semiconductor memory device.

FIG. 19C is a timing diagram showing an input signal latching operation in a case where the input signal timing varies during the input signal latching operation due to variations such as those in the voltage conditions of the device, those in the temperature conditions of the device, and those in the wire delay between the information processing device and the semiconductor memory device.

In the illustrated examples, the input signal latching circuit 602 latches the input signal 609 at the rising edge of the input clock 610.

The input signal latching operation shown in the timing diagram of FIG. 19A will now be described.

As the input signal goes "H" (high level) at time T01$a$, the input signal being "H" is latched by the input signal latching circuit 602 at the following rising edge of the clock, thus bringing the latched signal to "H".

As the input signal goes "L" (low level) at time T02$a$, the input signal being "L" is latched by the input signal latching circuit 602 at the following rising edge of the clock, thus bringing the latched signal to "L".

As the input signal goes "H" at time T03$a$, the input signal being "H" is latched by the input signal latching circuit 602 at the following rising edge of the clock, thus bringing the latched signal to "H".

As the input signal goes "L" at time T04$a$, the input signal being "L" is latched by the input signal latching circuit 602 at the following rising edge of the clock, thus bringing the latched signal to "L".

With the timing shown in FIG. 19A, the latched signal has the same waveform as the input signal.

The input signal latching operation shown in the timing diagram of FIG. 19B will now be described.

The input signal goes "H" at time T01$b$, but the input signal being "H" is not latched because time T01$b$ is after the rising edge of the clock. The input signal latching circuit 602 has latched, at the rising edge of the clock immediately before time T01$b$, the input signal being "L" before it goes "H", whereby the latched signal is "L".

Then, at time T02$b$, the input signal goes "L", but the input signal being "L" is not latched because time T02$b$ is after the rising edge of the clock. The input signal latching circuit 602 has latched, at the rising edge of the clock immediately before time T02$b$, the input signal being "H" before it goes "L", whereby the latched signal is "H".

Then, at time T03$b$, the input signal goes "H", but the input signal being "H" is not latched because time T03$b$ is after the rising edge of the clock. The input signal latching circuit 602 has latched, at the rising edge of the clock immediately before time T03$b$, the input signal being "L" before it goes "H", whereby the latched signal is "L".

Then, at time T04$b$, the input signal goes "L", but the input signal being "L" is not latched because time T04$b$ is after the rising edge of the clock. The input signal latching circuit 602 has latched, at the rising edge of the clock immediately before time T04$b$, the input signal being "H" before it goes "L", whereby the latched signal is "H".

With the timing shown in FIG. 19B, the input signal is output as the latched signal while being delayed by one clock cycle.

The input signal latching operation shown in the timing diagram of FIG. 19C will now be described.

As the input signal goes "H" at time T01$c$, the input signal being "H" is latched by the input signal latching circuit 602 at the following rising edge of the clock, thus bringing the latched signal to "H".

As the input signal goes "L" at time T02$c$, the input signal being "L" is latched by the input signal latching circuit 602 at the following rising edge of the clock, thus bringing the latched signal to "L".

Then, as the amount of delay of the input signal increases and the input signal goes "H" as late as at time T03$c$, the input signal being "H" is not latched because time T03$c$ is after the rising edge of the clock. The input signal latching circuit 602 has latched, at the rising edge of the clock immediately before T03$c$, the input signal being "L" before it goes "H", whereby the latched signal is "L".

As the input signal goes "L" at time T04$c$, the input signal being "L" is latched by the input signal latching circuit 602 at the following rising edge of the clock, thus bringing the latched signal to "L".

With the timing shown in FIG. 19C, the waveform of the input signal and that of the latched signal will be different from each other, and a signal different from the input signal will be given to the memory core 603.

In a memory system in which signals are exchanged in synchronism with a clock, the voltage conditions, the temperature conditions or the wire delay along the wires connecting the signal transmitting device with the signal receiving device may vary during operation, thus shifting the timing with which the signal receiving device receives the clock and the signal, thereby failing to satisfy the setup/hold time of the clock and the signal. This may cause an erroneous write, or an erroneous determination of the input signal by the signal receiving device. Particularly, where the clock frequency is high, it is difficult to set a setup/hold time such that the input signal is prevented from being determined erroneously by the signal receiving device, while taking the input timing into consideration.

There are techniques known in the art for the synchronous signal transfer operation, in which there is provided a circuit for delaying the clock and for determining a clock delay time such that the input signal is prevented from being determined erroneously (see, for example, Japanese Laid-Open Patent Publication No. 8-102729).

There are also other techniques known in the art for the synchronous signal transfer operation, in which there are provided a circuit for delaying the clock and the signal and a timer circuit for automatic timing adjustment, wherein a test for detecting a clock delay time such that the signal is prevented from being determined erroneously is performed for every passage of a period of time determined by the timer circuit (see, for example, Japanese Laid-Open Patent Publication No. 2001-154907).

With the technique of Japanese Laid-Open Patent Publication No. 8-102729, however, there is needed a clock test with human intervention in order to determine delay conditions. There is no countermeasures to a case where the clock and signal input timing varies due to variations in the voltage/temperature conditions during operation, or the like, and the predetermined delay setting is therefore no longer satisfied. Thus, the level of stability in practical operation is not sufficient.

With the technique of Japanese Laid-Open Patent Publication No. 2001-154907, the clock test for determining delay conditions requires registers for storing predetermined expected values. There are also needed a sequencer for realizing the clock test, and a timer circuit for executing the clock test at regular intervals. Since the clock test is not executed until the predetermined interval is over as measured by the timer circuit, signals may not be received normally if the clock and signal timing varies due to variations in the voltage/temperature conditions, or the like, before the next clock test is started.

SUMMARY OF THE INVENTION

The present invention has been made in view of the above, and has an object to realize the adjustment of timing between the clock signal and the data signal without performing a dedicated test operation.

In order to achieve the object set forth above, a first aspect of the present invention is directed to a semiconductor memory device to/from which a data signal is input/output in synchronism with a clock, including: an input signal delaying circuit for delaying an input signal to output the delayed input signal; a delayed clock generation circuit for delaying an input clock by different amounts of delay time to thereby generate a plurality of delayed clocks; a plurality of delayed input signal holding circuits for holding the delayed input signal on the plurality of delayed clocks, respectively; an input signal latch timing determination circuit for outputting a determination signal indicating a timing at which to latch the delayed input signal, based on a plurality of held signals held by the delayed input signal holding circuits; and a held signal selector circuit for integrating the plurality of held signals into a single signal.

Thus, it is possible to automatically select one of the plurality of delayed clocks of different amounts of delay time such that the input signal is prevented from being determined erroneously. Therefore, it is possible, for example, to eliminate the need for a complicated clock test sequence, a sequence for adjusting the phase difference between the clock and the input signal, and a sequencer circuit or a timer circuit for realizing a clock test.

A second aspect of the present invention is directed to the semiconductor memory device of the first aspect, further including a determination signal holding circuit for holding the determination signal output from the input signal latch timing determination circuit at a predetermined point in time, wherein the plurality of delayed input signal holding circuits are controlled based on the determination signal held by the determination signal holding circuit.

Thus, the determination signal holding circuit holds, at a predetermined point in time, a determination signal that indicates a delayed clock of such a timing that the input signal is prevented from being determined erroneously.

A third aspect of the present invention is directed to the semiconductor memory device of the second aspect, further including a determination/setting signal selector circuit, whereby the determination signal holding circuit selectively holds either the determination signal or a predetermined setting signal.

Thus, it is possible to set an arbitrary setting signal in the determination signal holding circuit to select an arbitrary delayed clock, instead of operating by natural selections.

A fourth aspect of the present invention is directed to the semiconductor memory device of the first aspect, wherein the input signal latch timing determination circuit compares each pair of the plurality of held signals held by the delayed input signal holding circuits, the pair being two signals held on delayed clocks with closest amounts of delay time to each other.

Thus, the input signal latch timing determination circuit compares every two of the plurality of held signals held by the delayed input signal holding circuits with each other, the two signals being those held on delayed clocks with closest amounts of delay time to each other.

A fifth aspect of the present invention is directed to a semiconductor memory device to/from which a data signal is input/output in synchronism with a clock, including: an input signal delaying circuit for delaying an input signal to output the delayed input signal; a delayed clock generation circuit for delaying an input clock by different amounts of delay time to thereby generate a plurality of delayed clocks; a plurality of delayed input signal holding circuits for holding the delayed input signal on the plurality of delayed clocks, respectively; an input signal latch timing determination circuit for outputting a determination signal indicating a timing at which to latch the delayed input signal, based on a plurality of held signals held by the delayed input signal holding circuits at a predetermined point in time; and a held signal selector circuit for integrating the plurality of held signals into a single signal, wherein the plurality of delayed input signal holding circuits are controlled based on the determination signal.

Thus, it is possible to automatically select, based on the plurality of held signals held by the delayed input signal holding circuits at a predetermined point in time, one of the plurality of delayed clocks of different amounts of delay time such that the input signal is prevented from being determined erroneously.

A sixth aspect of the present invention is directed to the semiconductor memory device of the fifth aspect, wherein: while the held signals being held by the delayed input signal holding circuits are all of the same level, the input signal latch timing determination circuit outputs a determination signal such that all the delayed input signal holding circuits are active; and when the held signal being held by any one of the delayed input signal holding circuits is of a different level from those of the other held signals, the input signal latch timing determination circuit outputs a determination signal such that only the one delayed input signal holding circuit is active.

Thus, it is possible to reset a determination signal indicating a delayed clock of a timing such that the input signal is prevented from being determined erroneously due to a predetermined reset operation or an initialization upon power-on, or the like.

A seventh aspect of the present invention is directed to a semiconductor memory device to/from which a data signal is input/output in synchronism with a clock, including: an input signal delaying circuit for delaying an input signal to output the delayed input signal; a delayed clock generation circuit for delaying an input clock by different amounts of delay time to thereby generate a plurality of delayed clocks; a plurality of first holding circuits for holding the delayed input signal on the plurality of delayed clocks, respectively; a plurality of second holding circuits for holding the held signals of the first holding circuits on one of the delayed clocks with a shortest amount of delay time; a latch timing determination circuit for generating timing determination signals for controlling transmissions of held signals output from the second holding circuits, based on the plurality of held signals of the first holding circuits, and holding the generated timing determination signals on one of the delayed clocks with a shortest amount of delay time; and a held signal selector circuit for controlling transmissions of the plurality of held signals output from the second holding circuits, based on the timing determination signals held by the timing determination circuit, and for integrating the held signals into a single signal.

An eighth aspect of the present invention is directed to the semiconductor memory device of the seventh aspect, wherein: the second holding circuits hold the held signals of the first holding circuits on one of the delayed clocks with a shortest amount of delay time; when the held signals of the first holding circuits are all of the same value, the input signal latch timing determination circuit selects the held signal of one of the second holding circuits that holds the held signal held by the first holding circuit on one of the delayed clocks with a shortest amount of delay time; and for each pair of held signals that are held by the first holding circuits on delayed clocks with closest amounts of delay time to each other, the input signal latch timing determination circuit selects the held signal of another second holding circuit based on a comparison between the pair of held signals.

Thus, it is possible to detect the transitions of the input signal while the semiconductor memory device is in operation, and to thereby automatically select a delayed clock of a timing such that the input signal is prevented from being determined erroneously. Therefore, even if the phase difference between the input signal and the clock changes due to changes in the power supply voltage or the temperature conditions, for example, it is possible to easily select a delayed clock of a timing such that the input signal is prevented from being determined erroneously.

A ninth aspect of the present invention is directed to a semiconductor memory device to/from which a data signal is input/output in synchronism with a clock, including: an input signal delaying circuit for delaying an input signal to output the delayed input signal; a double-cycle clock generation circuit for generating, from an input clock, a double-cycle clock having a cycle that is twice as long as that of the input clock; a double-cycle delayed clock generation circuit for delaying the double-cycle clock by different amounts of delay time to thereby generate a plurality of double-cycle delayed clocks; a plurality of first holding circuits for holding the delayed input signal at rising edges of the plurality of double-cycle delayed clocks, respectively; a plurality of second holding circuits for holding the delayed input signal at falling edges of the plurality of double-cycle delayed clocks, respectively; a plurality of third holding circuits for holding the held signals of the first holding circuits at the rising edges of the plurality of double-cycle delayed clocks, respectively; a plurality of fourth holding circuits for holding the held signals of the second holding circuits at the falling edges of the plurality of double-cycle delayed clocks, respectively; a first input signal latch timing determination circuit for generating first timing determination signals based on the plurality of held signals held by the first holding circuits, and holding the generated first timing determination signals at the rising edge of one of the double-cycle delayed clocks with a shortest amount of delay time; a second input signal latch timing determination circuit for generating second timing determination signals based on the plurality of held signals held by the second holding circuits, and holding the generated second timing determination signals at the falling edge of one of the double-cycle delayed clocks with a shortest amount of delay time; a first signal logical value determination circuit for outputting a first logical value determination signal based on whether the first timing determination signals held by the first input signal latch timing determination circuit are all of the same value; a second signal logical value determination circuit for outputting a second logical value determination signal based on whether the second timing determination signals held by the second input signal latch timing determination circuit are all of the same value; a plurality of first held signal transmission control circuits for controlling transmissions of the held signals output from the third holding circuits, based on the first timing determination signals held by the first input signal latch timing determination circuit and the first logical value determination signal; a plurality of second held signal transmission control circuits for controlling transmissions of the held signals output from the fourth holding circuits, based on the second timing determination signals held by the second input signal latch timing determination circuit and the second logical value determination signal; a plurality of fifth holding circuits for holding signals output from the first held signal transmission control circuit at the rising edge of one of the double-cycle delayed clocks with a shortest amount of delay time; a plurality of sixth holding circuits for holding signals output from the second held signal transmission control circuit at the falling edge of one of the double-cycle delayed clocks with a shortest amount of delay time; a plurality of held signals selector circuits for selecting either the held signals output from the fifth holding circuits or the held signals output from the sixth holding circuits, based on the plurality of double-cycle delayed clocks; and a selection signal selector circuit for integrating the signals output from the plurality of selector circuits into a single signal.

A tenth aspect of the present invention is directed to the semiconductor memory device of the ninth aspect, wherein: the first input signal latch timing determination circuit compares each pair of the plurality of held signals held by the first holding circuits to generate the first timing determination signal, the pair being two signals held on double-cycle delayed clocks with closest amounts of delay time to each other; the second input signal latch timing determination circuit compares each pair of the plurality of held signals held by the second holding circuits to generate the second timing determination signal, the pair being two signals held on double-cycle delayed clocks with closest amounts of delay time to each other; one of the plurality of first held signal transmission control circuits for controlling the transmission of the signal that is held by the first holding circuit on one of the double-cycle delayed clocks with a shortest amount of delay time and that is further held by the third holding circuit is controlled based on the first logical value determination signal, whereas the other first held signal transmission control circuits are controlled by the first timing determination signals; and one of the plurality of second held signal transmission control circuits for controlling the transmission of the signal that is held by the second holding circuit on one of the double-cycle delayed clocks with a shortest amount of delay time and that is further held by the fourth holding circuit is controlled based on the second logical value determination signal, whereas the other second held signal transmission control circuits are controlled by the second timing determination signal.

Thus, it is again possible to detect the transitions of the input signal while the semiconductor memory device is in operation, and to thereby automatically select a delayed clock of a timing such that the input signal is prevented from being determined erroneously. Therefore, even if the phase difference between the input signal and the clock changes due to changes in the power supply voltage or the temperature conditions, for example, it is possible to easily select a delayed clock of a timing such that the input signal is prevented from being determined erroneously.

Eleventh to thirteenth aspects of the present invention are directed to the semiconductor memory devices of the first, fifth and seventh aspects, respectively, further including: a phase difference detection circuit for detecting a phase difference between the input signal and the clock based on the determination signal output from the input signal latch timing determination circuit; and an output signal timing adjustment circuit for adjusting an output timing of the output data signal based on the detected phase difference.

A fourteenth aspect of the present invention is directed to the semiconductor memory device of the ninth aspect, further including: a determination signal selector circuit for selecting, based on the double-cycle delayed clocks, either: the first timing determination signal output from the first input signal latch timing determination circuit and the first logical value determination signal; or the second timing determination signal output from the second input signal latch timing determination circuit and the second logical value determination signal; a phase difference detection circuit for detecting a phase difference between the input signal and the clock based on the signals output from the determination signal selector circuit; and an output signal timing adjustment circuit for adjusting an output timing of the output data signal based on the detected phase difference.

Thus, it is possible to detect the phase difference between the input signal and the clock and to thereby output an output signal whose timing has been adjusted by an amount corresponding to the phase difference between the input signal and the clock.

A memory system of the present invention includes: one of the semiconductor memory devices of the eleventh to fourteenth aspects; and an information processing device operating on a common clock with the semiconductor memory device for inputting/outputting stored data to/from the semiconductor memory device.

Thus, it is possible to detect the phase difference between the input signal and the clock and to thereby output an output signal whose timing has been adjusted by an amount corresponding to the phase difference between the input signal and the clock, whereby the information processing device can easily receive signals from the semiconductor memory device at a timing such that the input signal is prevented from being determined erroneously with respect to the clock. Therefore, it is possible to, for example, eliminate the need for a circuit dedicated to signal latch timing adjustment in the information processing device, thereby reducing the required circuit area.

DETAILED DESCRIPTION OF THE PREFERRED EMBODIMENTS

Figure 1:
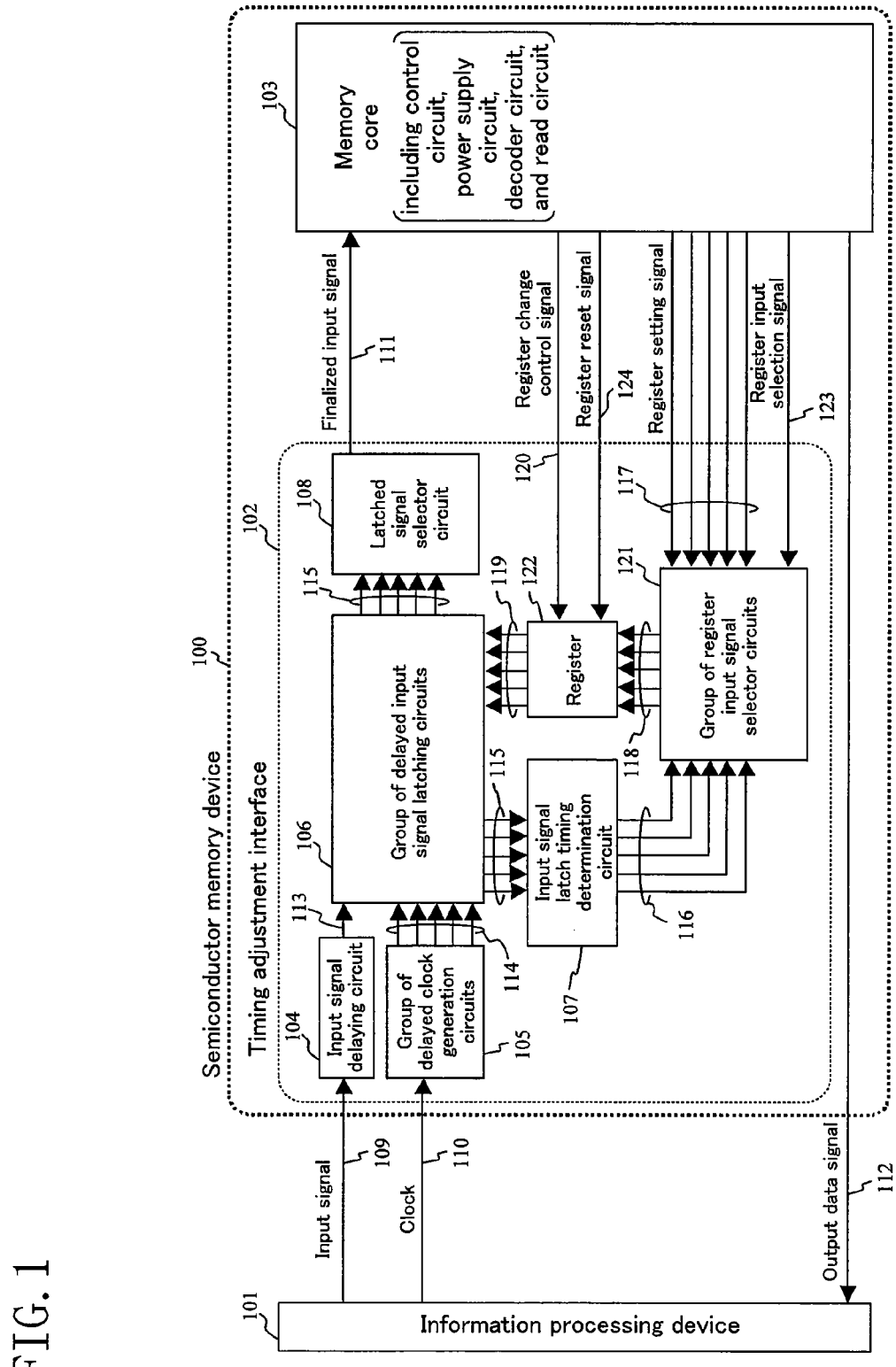
FIG. 1 is a schematic block diagram showing a configuration of a part of a semiconductor memory device 100 according to Embodiment 1 of the present invention.

Preferred embodiments of the present invention will now be described with reference to the drawings. In each of the following embodiments, like elements to those of another embodiment will be denoted by like reference numerals, and will not be described redundantly.

Embodiment 1

FIG. 1 is a schematic block diagram showing a configuration of a part of a semiconductor memory device 100 according to Embodiment 1 of the present invention.

The semiconductor memory device 100 and an information processing device 101 for controlling the semiconductor memory device 100 are connected to each other by an input signal 109, a clock 110, and an output data signal 112. The semiconductor memory device 100 includes a timing adjustment interface 102 and a memory core 103. The timing adjustment interface 102 and the memory core 103 are connected to each other by a finalized input signal 111, a register change control signal 120, a register reset signal 124, a register setting signal 117, and a register input selection signal 123. The register change control signal 120, the register input selection signal 123 and the register reset signal 124 are signals output from the control circuit of the memory core 103. The register setting signal 117 may be either a signal output from the control circuit of the memory core 103 or stored data read out from the memory core 103.

The register reset signal 124 is a signal that can be activated from a tester at a predetermined timing during the test operation.

The memory core 103 includes a control circuit, a power supply circuit, a decoder circuit and a read circuit for operating the memory core 103.

The timing adjustment interface 102 includes an input signal delaying circuit 104, a group of delayed clock generation circuits 105, a group of delayed input signal latching circuits 106, an input signal latch timing determination circuit 107, a latched signal selector circuit 108, a group of register input signal selector circuits 121, and a register 122.

The input signal delaying circuit 104 delays the input signal 109 to output a delayed input signal 113 to the group of delayed input signal latching circuits 106.

The group of delayed clock generation circuits 105 delays the input clock 110 to output n (n is an integer) delayed clocks 114 of different amounts of delay to the group of delayed input signal latching circuits 106. The difference between the maximum and minimum amounts of delay among the delayed clocks 114 is set to be less than or equal to the cycle of the input clock 110. It is normally preferred that the difference is set to be as large as possible (e.g., to be equal to the cycle).

The group of delayed input signal latching circuits 106 latches the delayed input signal 113 on the n delayed clocks 114 to output n latched signals 115 to the latched signal selector circuit 108 and to the input signal latch timing determination circuit 107. The operation of latching the delayed input signal 113 on the delayed clocks 114 is controlled by a register signal 119 from the register 122, as will be described below.

The input signal latch timing determination circuit 107 compares the latched signals 115 with one another to output determination signals 116. The determination signals 116 are input to the group of register input signal selector circuits 121.

The group of register input signal selector circuits 121 selects either the determination signals 116 or the register setting signals 117 to output register input signals 118 based on the register input selection signal 123. The register input signals 118 are input to the register 122.

The register reset signal 124 resets the value of the register 122.

When the register change control signal 120 is activated, the register 122 overwrites the value of the register 122 with the value of the register input signal 118 to output the register signal 119.

The latched signal selector circuit 108 integrates the latched signals 115 received from the group of delayed input signal latching circuits 106 into a single finalized input signal 111.

Figure 2:
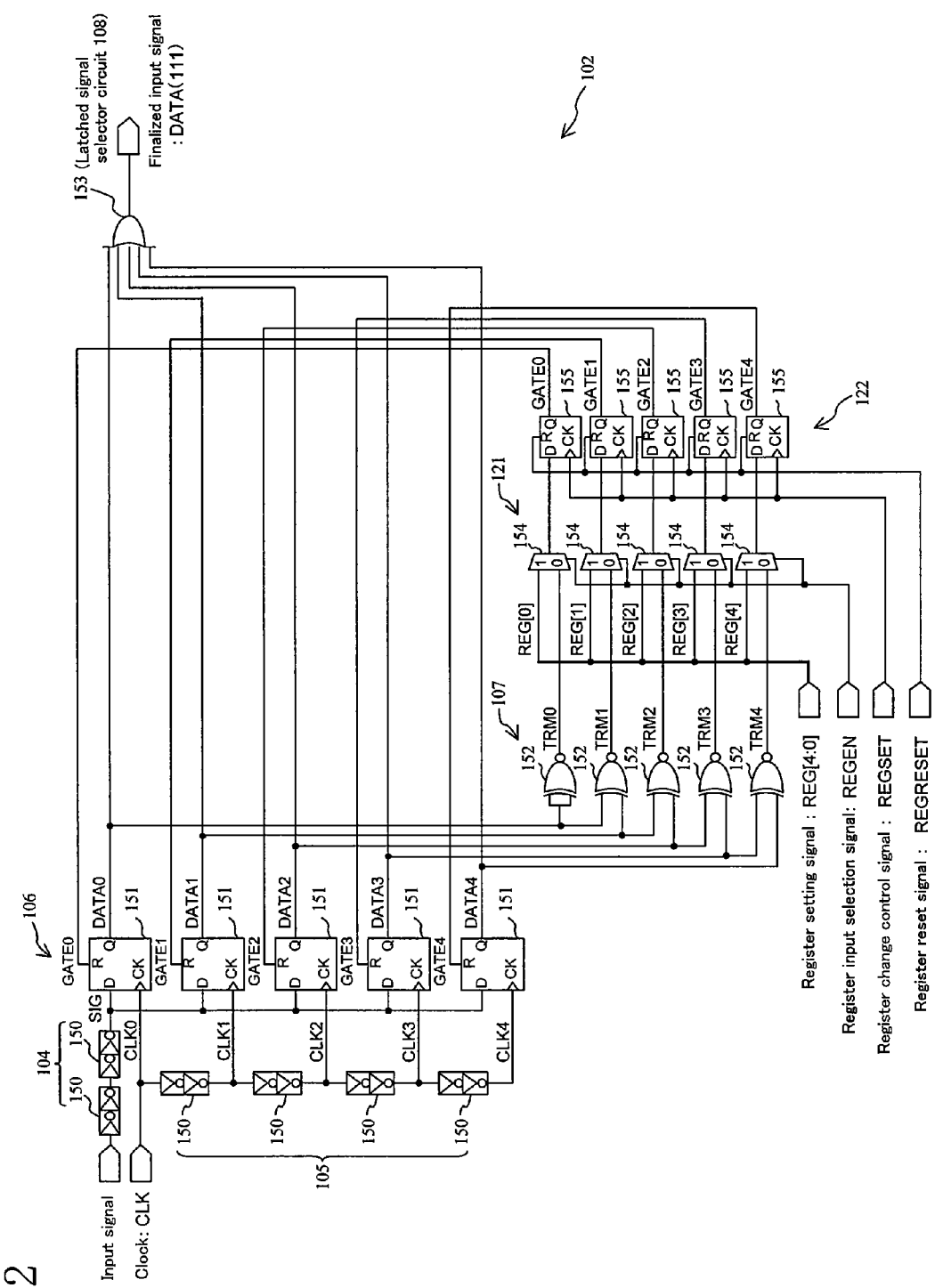
FIG. 2 is a circuit diagram showing a configuration of a timing adjustment interface 102 according to Embodiment 1 of the present invention.

FIG. 2 is a circuit diagram showing a specific configuration of the timing adjustment interface 102 where n=5. Note that n is not limited to five.

The input signal delaying circuit 104 includes two delay sections 150 for delaying the input signal 109 to output a delayed input signal SIG (the delayed input signal 113).

The group of delayed clock generation circuits 105 include the delay sections 150 connected in series for receiving an input clock CLK to output delayed clocks CLK0 to CLK4 (the delayed clocks 114) of different delay times. The delay sections 150 of the input signal delaying circuit 104 and the group of delayed clock generation circuits 105 are not limited to any particular means, and may be, for example, a plurality of inverter circuits connected in series so as to provide an intended delay time.

The group of delayed input signal latching circuits 106 include five latch circuits 151, which when register signals GATE0 to GATE4 (the register signals 119) from the register 122 are "L" latch the delayed input signals SIG on the delayed clocks CLK0 to CLK4 to output latched signals DATA0 to DATA4 (the latched signals 115), respectively, as will be described below. When the register signals GATE0 to GATE4 go "H", the latch circuits 151 are reset, and the latched signals DATA0 to DATA4 go "L".

The input signal latch timing determination circuit 107 includes five EX-NOR circuits 152. The EX-NOR circuits 152 receive different pairs of adjacent ones of the latched signals DATA0 to DATA4 to output determination signals TRM0 to TRM4 (the determination signals 116).

The group of register input signal selector circuits 121 include five selectors 154. The selector 154 selects register setting signals REG [4:0] (the register setting signals 117) when a register input selection signal REGEN (the register input selection signal 123) is "H", and selects the determination signals TRM0 to TRM4 when the register input selection signal REGEN is "L".

The register 122 includes five latch circuits 155 for latching the outputs of the selectors 154 at the rising edge of a register change control signal REGSET (the register change control signal 120) to finalize the register signals GATE0 to GATE4 (the register signals 119). The register signals GATE0 to GATE4 are input to the reset terminals of the latch circuits 151, thereby controlling the respective latched signals DATA0 to DATA4. Specifically, the latch circuit 151 whose register signal goes "H" is reset, and the output of the reset latch circuit 151 is kept "L". Thus, only the latched signals of those latch circuits 151 whose register signal is "L" are valid and allowed to transition according to the delayed input signal SIG.

The latched signals DATA0 to DATA4 are input to an OR circuit 153 (the latched signal selector circuit 108), and the logical sum thereof is output as a finalized input signal DATA (the finalized input signal 111).

Figure 3:
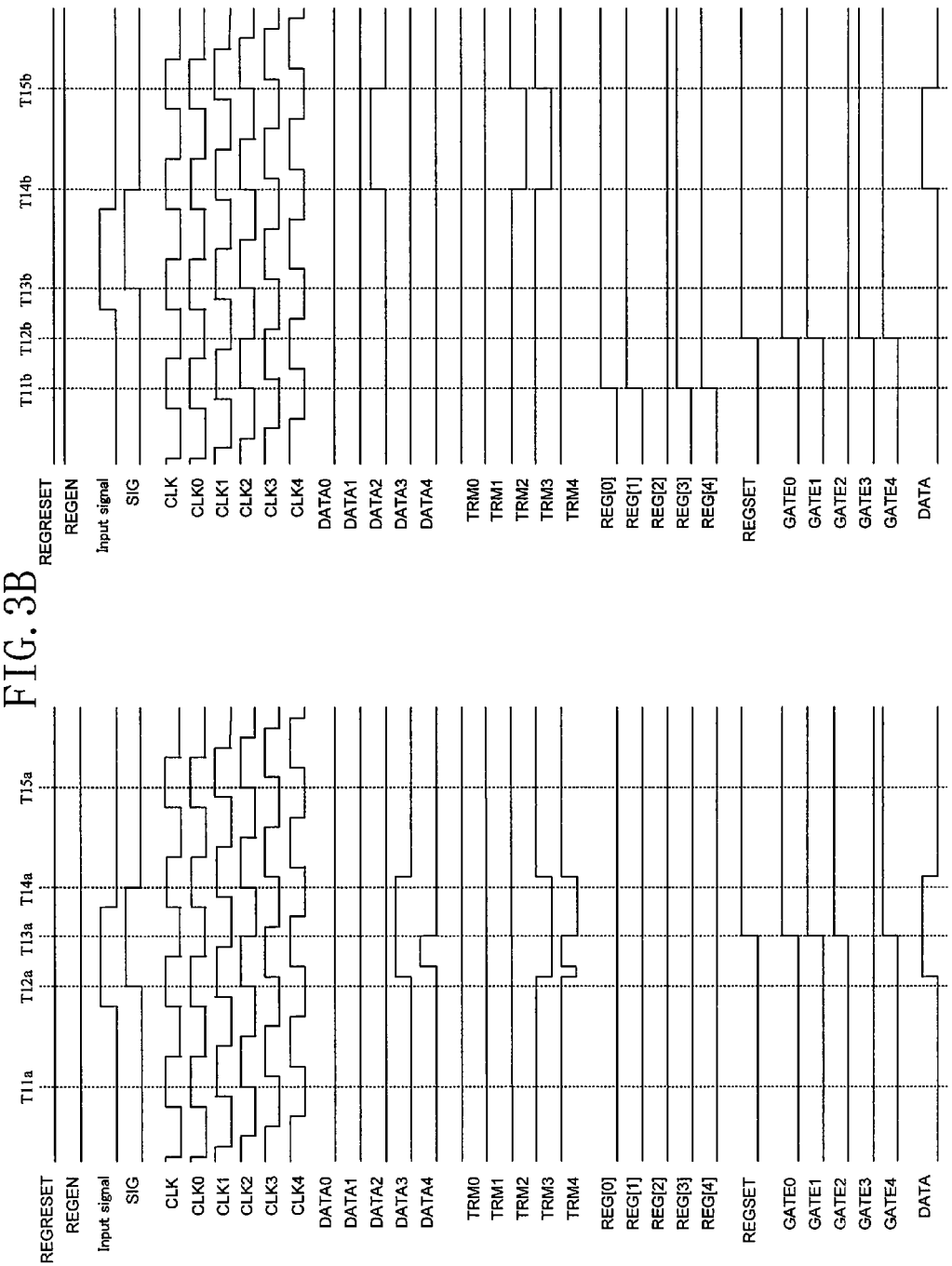
FIGS. 3A and 3B are timing diagrams showing a timing adjustment operation where a register input selection signal REGEN is "L" and where it is "H" according to Embodiment 1 of the present invention.

FIG. 3A shows waveforms during a timing adjustment operation to be performed with a circuit configuration shown in FIG. 2, where the register input selection signal REGEN is "L", i.e., where the determination signals TRM0 to TRM4 are valid. It is herein assumed that the register setting signals REG [4:0] are all "L".

Assuming that a register reset signal REGRESET has gone "H" before time T11a, the register 122 is reset, and the register signals GATE0 to GATE4 are all kept "L" unless the register change control signal REGSET rises thereafter.

The delayed input signal SIG remains unchanged at "L" around time T11a, whereby the latched signals DATA0 to DATA4 are all "L". Since the latched signals DATA0 to DATA4 are all "L", the determination signals TRM0 to TRM4 are all "H".

Then, the input signal transitions from "L" to "H", and the delayed input signal SIG goes "H" at time T12a. Since the delayed clocks CLK3 and CLK4 rise after time T12a, those latch circuits 151 that latch the delayed input signal SIG on the delayed clocks CLK3 and CLK4 latch the delayed input signal SIG at "H", whereby the latched signals DATA3 and DATA4 go "H" at respective points in time as shown in the figure. Since the delayed clocks CLK0 to CLK2 rise before time T12a, those latch circuits 151 that latch the delayed input signal SIG on the delayed clocks CLK0 to CLK2 latch the delayed input signal SIG at "L" before it goes "H", whereby the latched signals DATA0 to DATA2 are "L".

After the latch circuit 151 that latches the delayed input signal SIG on the delayed clock CLK4 latches the delayed input signal SIG after time T12a, the latched signals DATA0 to DATA2 are of the same logical value, the latched signals DATA3 and DATA4 are of the same logical value, and the latched signals DATA2 and DATA3 are of different logical values, whereby the determination signals TRM0 to TRM2 and TRM4 are "H" and the determination signal TRM3 is "L".

As the register change control signal REGSET goes "H" at time T13a, the determination signals TRM0 to TRM4 are latched by the latch circuits 155, whereby the register signals GATE0 to GATE2 and GATE4 are "H" and the register signal GATE3 is "L". Since the register signals GATE0 to GATE4 are controlling the reset terminals of the latch circuits 151, the latched signals DATA0 to DATA2 and DATA4 are "L", with only the latched signal DATA3 being valid.

Then, the input signal transitions from "H" to "L", and the delayed input signal SIG goes "L" at time T14a. Then, the latched signal DATA3 goes "L" at the rising edge of the delayed clock CLK3. The finalized input signal DATA goes "L" in synchronism with the latched signal DATA3.

At time T15a, the delayed input signal SIG remains unchanged at "L", whereby DATA3 remains "L" and DATA, being in synchronism with DATA3, also remains "L".

As described above, once the register signals GATE0 to GATE4 are set after detecting a transition of the input signal, one of the latched signals DATA0 to DATA4 becomes valid, and the finalized input signal DATA transitions in synchronism with the selected one of the latched signals DATA0 to DATA4, until the values of the register signals GATE0 to GATE4 change thereafter.

Although the latched signal DATA3 is selected in the illustrated example, any other latched signals may be selected depending on the timing of the input signal. In other words, the input signal can be latched on one of the delayed clocks CLK1 to CLK4, no matter when the input signal is input. The precision of the timing of latching the input signal can be improved by increasing the number of delayed clocks to be generated.

FIG. 3B shows waveforms during the timing adjustment operation to be performed with the circuit configuration shown in FIG. 2, where the register input selection signal REGEN is "H", i.e., where the register setting signals REG [4:0] are valid.

Assuming that the register reset signal REGRESET has gone "H" before time T11b, the register 122 is reset, and the register signals GATE0 to GATE4 are all kept "L" unless the register change control signal REGSET rises thereafter.

The delayed input signal SIG remains unchanged at "L" around time T11b, whereby the latched signals DATA0 to DATA4 are all "L". Since the latched signals DATA0 to DATA4 are all "L", the determination signals TRM0 to TRM4 are all "H". Although the register setting signals REG [1:0] and REG [4:3] are set to "H" and the register setting signal REG [2] to "L", the register signals GATE0 to GATE4 are all "L" since the register change control signal REGSET is "L".

As the register change control signal REGSET goes "H" at time T12b, the register setting signals REG [4:0] are latched by the latch circuits 155, whereby the register signals GATE0 to GATE1, GATE3 and GATE4 are "H" and the register signal GATE2 is "L". Since the register signals GATE0 to GATE4 are controlling the reset terminals of the latch circuits 151, the latched signals DATA0 to DATA1, DATA3 and DATA4 are "L", with only the latched signal DATA2 being valid. Thereafter, the finalized input signal DATA transitions in synchronism with the latched signal DATA2.

Then, the input signal transitions from "L" to "H", and the delayed input signal SIG goes "H" at time T13b. Since the delayed clock CLK2 rises before time T13b, the latch circuit 151 that latches the delayed input signal SIG on the delayed clock CLK2 latches the delayed input signal SIG at "L" before it goes "H", whereby the latched signal DATA2 is "L". Then, the finalized input signal DATA is "L". Since the latched signals DATA0 to DATA4 are all of the same logical value, the determination signals TRM0 to TRM4 are all "H".

Then, the input signal transitions from "H" to "L", and the delayed input signal SIG goes "L" at time T14b. Then, the latched signal DATA2 goes "H" at the rising edge of the delayed clock CLK2. The finalized input signal DATA goes "H" in synchronism with the latched signal DATA2. Although the determination signals TRM2 and TRM3 go "L", following the transition of the latched signal DATA2, the determination signals TRM0 to TRM4 will not be output from the selectors 154 since the register input selection signal REGEN is "H", and the determination signals TRM0 to TRM4 will not be latched by the latch circuits 155 since the register change control signal REGSET is "H".

At time T15b, the delayed input signal SIG is "L" and the latched signal DATA2 goes "L" at the rising edge of the delayed clock CLK2. The finalized input signal DATA goes "L" in synchronism with the latched signal DATA2.

As described above, by setting the register input selection signal REGEN to "H", it is possible to set the register signals GATE0 to GATE4 based on the register setting signals REG [4:0], irrespective of the transitions of the input signal, and to arbitrarily select one of the latched signals DATA0 to DATA4.

With the provision of the timing adjustment interface 102 having such a circuit configuration, it is possible, by means of a simple test operation of transitioning the input signal in synchronism with the clock, to automatically determine the timing at which to latch the input signal such that the input signal is prevented from being determined erroneously due to the phase difference between the input signal and the clock, without requiring a complicated clock test sequence for the phase adjustment between the input signal and the clock or a sequencer circuit for realizing the clock test. Moreover, it is also possible to arbitrarily set the timing at which to latch the input signal.

Particularly, it is possible to ensure a sufficient setup time for the latch circuit (the holding circuit) latching the input signal, depending on the timing of transition of the input signal, and it is also easily possible to ensure a sufficient hold time by ensuring that the input signal is latched within as small a timing margin as possible (within a predetermined range of timing margin). Thus, it is easily possible to use a high-frequency clock such that the cycle thereof is close to the sum of the setup time and the hold time, for example.

The timing of the delayed clock is not limited to that described above, i.e., a timing at which any of the latched signals transitions, but the present invention may also employ a timing with an amount of delay slightly greater than that described above (e.g., by one or more clock cycles or by a predetermined amount of time) such that a sufficient setup time can be ensured more reliably, as long as a sufficient hold time can be ensured. The detection of the timing of transition of the input signal is not limited to that based on latched signals of a plurality of latch circuits as described above, but may be done by, for example, determining a delayed clock that transitions immediately before or immediately after the transition of the input signal, for example. The present invention is also not limited to a case as described above where the input signal is stored in only a selected one of the latch circuits receiving different delayed clocks. For example, the input signal may be stored in all latch circuits, wherein the latched signal from one of the latch circuits is selected, or the input signal may be latched with one latch circuit receiving a selected one of the delayed clocks. These possible modifications are all applicable to the other embodiments to follow.

Embodiment 2

Figure 4:
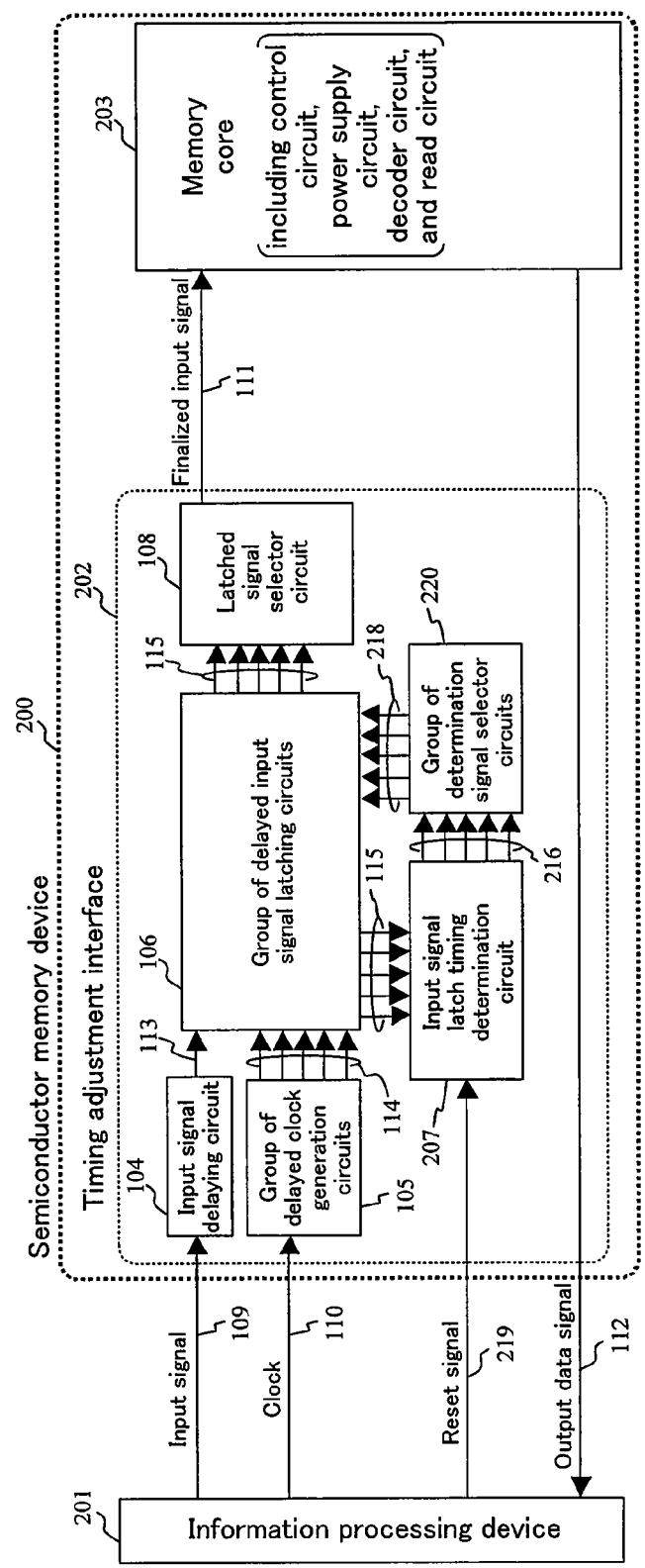
FIG. 4 is a schematic block diagram showing a configuration of a part of a semiconductor memory device 200 according to Embodiment 2 of the present invention.

FIG. 4 is a schematic block diagram showing a configuration of a part of a semiconductor memory device 200 according to Embodiment 2 of the present invention.

The semiconductor memory device 200 and an information processing device 201 for controlling the semiconductor memory device 200 are connected to each other by a reset signal 219, in addition to the input signal 109, the clock 110 and the output data signal 112. The semiconductor memory device 200 includes a timing adjustment interface 202 and a memory core 203. The timing adjustment interface 202 and the memory core 203 are connected to each other by the finalized input signal 111.

The memory core 203 includes a control circuit, a power supply circuit, a decoder circuit and a read circuit for operating the memory core 203.

The timing adjustment interface 202 includes the input signal delaying circuit 104, the group of delayed clock generation circuits 105, the group of delayed input signal latching circuits 106, an input signal latch timing determination circuit 207, the latched signal selector circuit 108, and a group of determination signal selector circuits 220.

The input signal delaying circuit 104 delays the input signal 109 to output the delayed input signal 113 to the group of delayed input signal latching circuits 106.

The group of delayed clock generation circuits 105 delays the input clock 110 to output n (n is an integer) delayed clocks 114 of different amounts of delay to the group of delayed input signal latching circuits 106.

The group of delayed input signal latching circuits 106 latches the delayed input signal 113 on the n delayed clocks 114 to output n latched signals 115 to the latched signal selector circuit 108 and to the input signal latch timing determination circuit 207. The operation of latching the delayed input signal 113 on the delayed clocks 114 is controlled by latch circuit control signals 218 from the group of determination signal selector circuits 220, as will be described below.

The input signal latch timing determination circuit 207 compares the latched signals 115 with one another to output determination signals 216. The determination signals 216 are reset by the reset signal 219 output from the information processing device 201. The determination signals 216 are input to the group of determination signal selector circuits 220. The reset signal 219 may be activated upon power-on, or may be activated at an arbitrary timing during the test operation.

The group of determination signal selector circuits 220 output the latch circuit control signals 218 for controlling the group of delayed input signal latching circuits 106 depending on the logical values of the determination signals 216.

The latched signal selector circuit 108 integrates the latched signals 115 received from the group of delayed input signal latching circuits 106 into a single finalized input signal 111.

Figure 5:
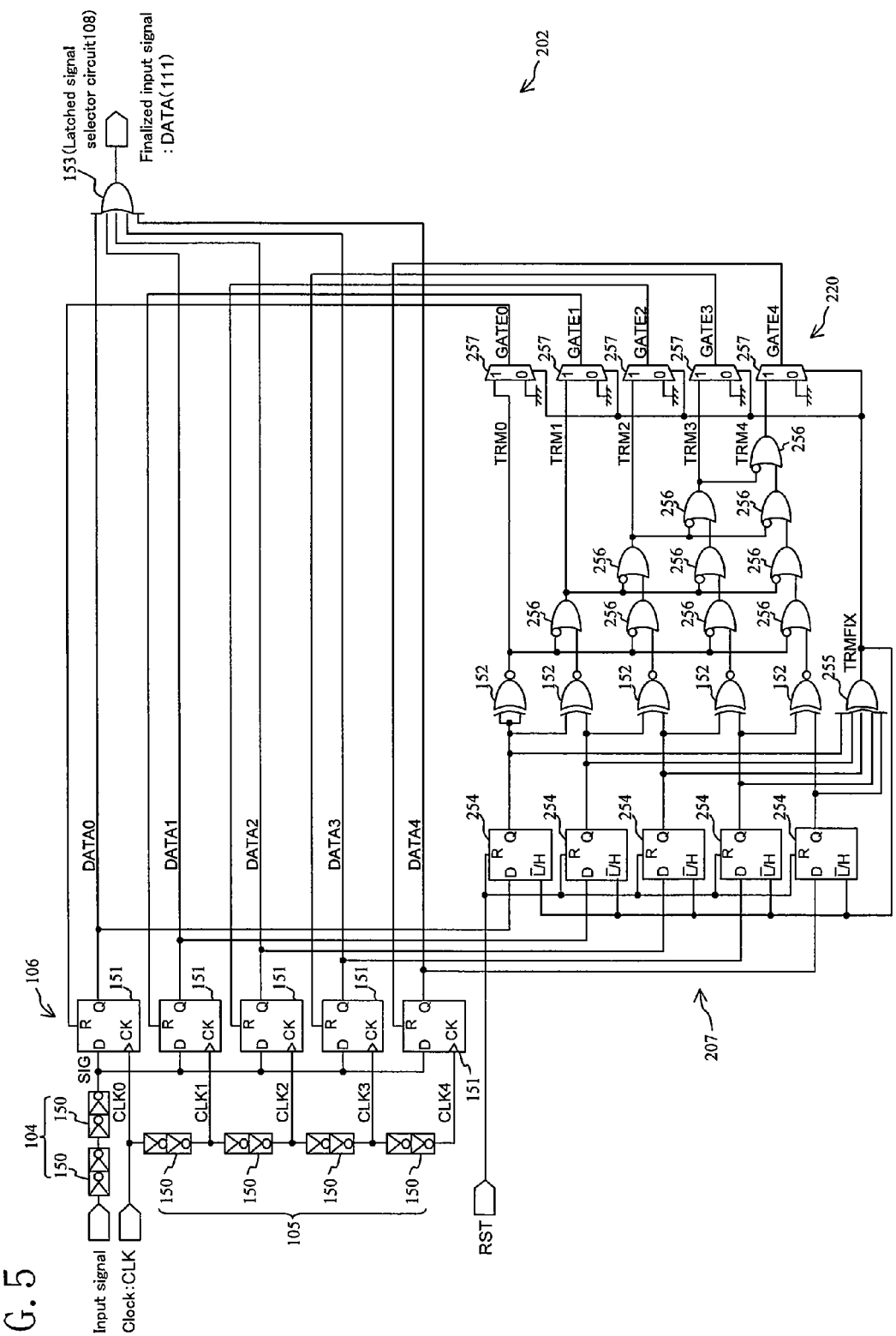
FIG. 5 is a circuit diagram showing a configuration of a timing adjustment interface 202 according to Embodiment 2 of the present invention.

FIG. 5 is a circuit diagram showing a specific configuration of the timing adjustment interface 202 where n=5.

The input signal delaying circuit 104 includes two delay sections 150 for delaying the input signal 109 to output the delayed input signal SIG (the delayed input signal 113).

The group of delayed clock generation circuits 105 include the delay sections 150 connected in series for receiving the input clock CLK to output delayed clocks CLK0 to CLK4 (the delayed clocks 114) of different delay times. The delay sections 150 of the input signal delaying circuit 104 and the group of delayed clock generation circuits 105 are not limited to any particular means, and may be, for example, a plurality of inverter circuits connected in series so as to provide an intended delay time.

The group of delayed input signal latching circuits 106 include five latch circuits 151, which when the latch circuit control signals GATE0 to GATE4 (the latch circuit control signals 218) from the group of determination signal selector circuits 220 are "L" latch the delayed input signal SIG on the delayed clocks CLK0 to CLK4 to output the latched signals DATA0 to DATA4 (the latched signals 115), respectively, as will be described below. When the latch circuit control signals GATE0 to GATE4 go "H", the latch circuits 151 are reset, and the latched signals DATA0 to DATA4 go "L".

The input signal latch timing determination circuit 207 includes five D flip-flops with load/hold 254, five EX-NOR circuits 152, an EX-OR circuit 255, and 10 logic elements 256.

The D flip-flops with load/hold 254 of the input signal latch timing determination circuit 207 receive the latched signals DATA0 to DATA4, and the load/hold thereof is controlled by a determination signal TRMFIX output from the EX-OR circuit 255. Thus, while the determination signal TRMFIX is "L", the received latched signals DATA0 to DATA4 are output as they are, whereas when the determination signal TRMFIX is "H", the levels of the latched signals DATA0 to DATA4 input immediately before are held. The output of the D flip-flops with load/hold 254 is reset by a reset signal RST.

The EX-NOR circuits 152 of the input signal latch timing determination circuit 207 receive different pairs of adjacent ones of the outputs from the D flip-flops with load/hold 254, and the outputs of the EX-NOR circuits 152 are output as the determination signals TRM0 to TRM4 (the determination signals 216) through a combination circuit of the logic elements 256.

The combination circuit of the logic elements 256 of the input signal latch timing determination circuit 207 operates as follows. For example, when the output of the second EX-NOR circuit 152 from the top in FIG. 5 goes "L", the combination circuit of the logic elements 256 suppresses the outputs of the third and subsequent EX-NOR circuits 152 (irrespective of the outputs of the third to fifth EX-NOR circuits 152), whereby the determination signals TRM2 to TRM4 are "H".

The EX-OR circuit 255 of the input signal latch timing determination circuit 207 receive the outputs of all the D flip-flops with load/hold 254 to output the determination signal TRMFIX, which is "L" when the outputs are all of the same logical value, and is "H" otherwise. The determination signal TRMFIX is input to the load/hold terminal of each D flip-flop with load/hold 254 and the select terminal of each selector circuit 257.

The selector circuits 257 receive the determination signals TRM0 to TRM4 to output the latch circuit control signals GATE0 to GATE4, respectively. The latch circuit control signals GATE0 to GATE4 are all "L" if the determination signal TRMFIX is "L", and are at the same level as the respective determination signals TRM0 to TRM4 if the determination signal TRMFIX is "H". The latch circuit control signals GATE0 to GATE4 are input to the reset terminals of the latch circuits 151 to thereby control the latch circuits 151. Specifically, the latch circuit 151 whose latch circuit control signals GATE0 to GATE4 goes "H" is reset, and the output of the reset latch circuit 151 is kept "L". Thus, only the latched signals of those latch circuits 151 whose latch circuit control signals GATE0 to GATE4 is "L" are valid and allowed to transition according to the delayed input signal SIG.

The latched signals DATA0 to DATA4 are input to the OR circuit 153 (the latched signal selector circuit 108), and the logical sum thereof is output as the finalized input signal DATA (the finalized input signal 111).

Figure 6:
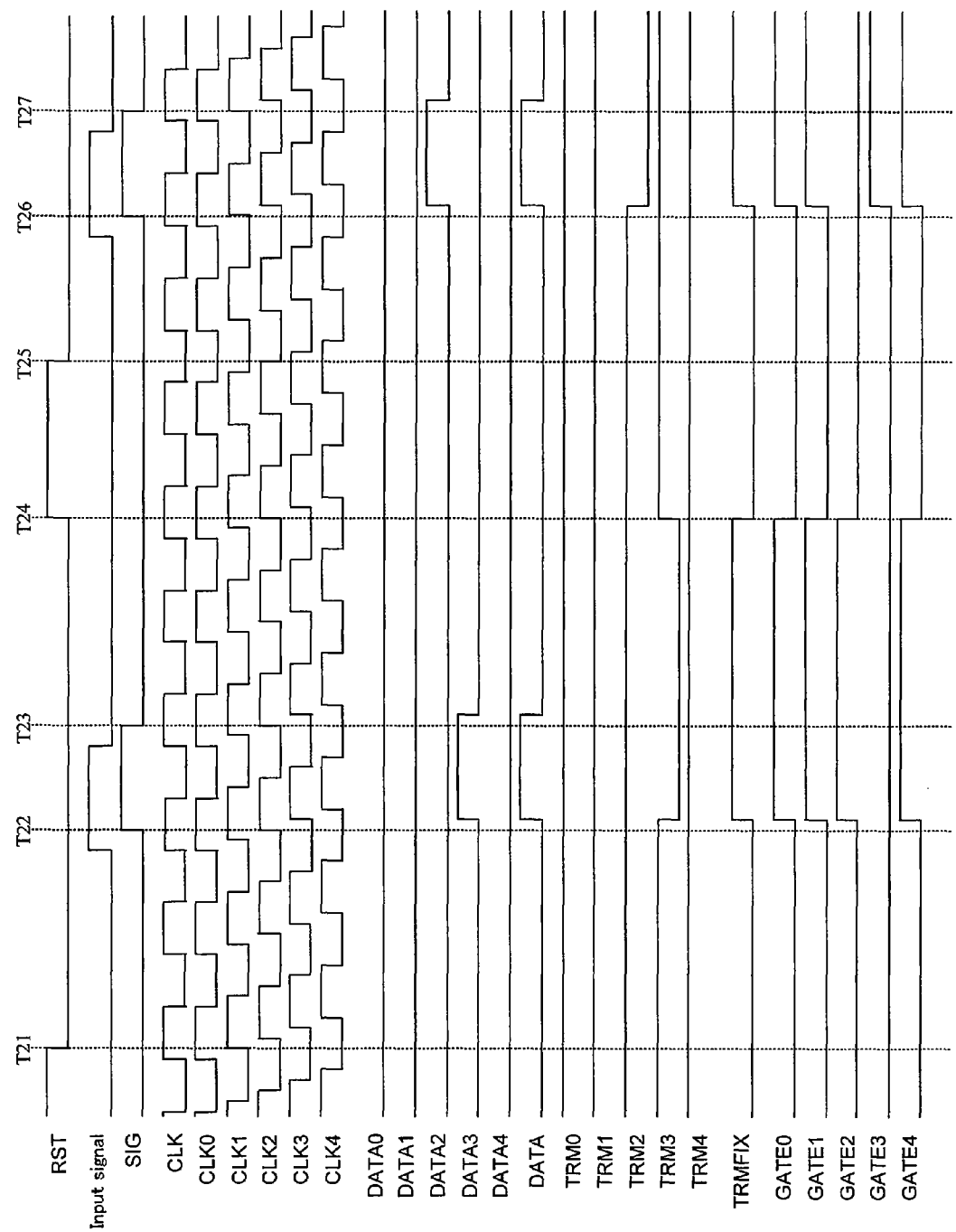
FIG. 6 is a timing diagram showing a timing adjustment operation according to Embodiment 2 of the present invention.

FIG. 6 shows waveforms during a timing adjustment operation to be performed with a circuit configuration shown in FIG. 5.

The reset signal RST goes "L" at time T21. Since the latched signals DATA0 to DATA4 are all "L", the determination signals TRM0 to TRM4 are all "H" and the determination signal TRMFIX is "L". Since the determination signal TRMFIX is "L", the D flip-flops with load/hold 254 are in the load state, and the latched signals DATA0 to DATA4 are input to the EX-NOR circuits 152. With the determination signal TRMFIX being "L", the latch circuit control signals GATE0 to GATE4 are "L". Until time T22, the delayed input signal SIG remains unchanged, whereby the latched signals DATA0 to DATA4 remain "L", the D flip-flops with load/hold 254 remain in the load state, and the latch circuit control signals GATE0 to GATE4 remain "L".

Then, the input signal goes "H", and the delayed input signal SIG goes "H" at time T22. Since the delayed clock CLK3 rises immediately after time T22, the latch circuit 151 that latches the delayed input signal SIG on the delayed clock CLK3 latches the delayed input signal SIG at "H", whereby the latched signal DATA3 goes "H". Since the delayed clocks CLK0 to CLK2 rise before time T22, those latch circuits 151 that latch the delayed input signal SIG on the delayed clocks CLK0 to CLK2 latch the delayed input signal SIG at "L" before it goes "H", whereby the latched signals DATA0 to DATA2 are "L".

As the latched signal DATA3 goes "H", the determination signal TRMFIX goes "H". As the determination signal TRMFIX goes "H", the D flip-flops with load/hold 254 enter the hold state, whereby the outputs of the D flip-flops with load/hold 254 are fixed to the latched signals DATA0 to DATA4 immediately before the holding. Since the latched signals DATA0 to DATA2 are "L" and the latched signal DATA3 is "H", the determination signals TRM0 to TRM2 and TRM4 are "H" and the determination signal TRM3 is "L" because of the combination circuit of the logic elements 256. Moreover, since the determination signal TRMFIX is "H", the determination signals TRM0 to TRM4 are selected as the outputs of the selector circuits 257, whereby the latch circuit control signals GATE0 to GATE2 and GATE4 are "H" and the latch circuit control signal GATE3 is "L". The latched signals DATA0 to DATA4 to be output from the latch circuits 151 are controlled by the latch circuit control signals GATE0 to GATE4 so that the latched signals DATA0 to DATA2 and DATA4 are fixed to "L", with only the latched signal DATA3 being valid. Since the D flip-flops with load/hold 254 are in the hold state, there will be no change to the determination signals TRM0 to TRM4, and hence the latch circuit control signals GATE0 to GATE4, even if the latched signals DATA0 to DATA4 later transition. Thereafter, the finalized input signal DATA transitions in synchronism with the latched signal DATA3.

Then, as the input signal goes "L" and the delayed input signal SIG goes "L" at time T23, the latched signal DATA3 goes "L" at a point in time as shown in the figure. The finalized input signal DATA goes "L" in synchronism with the latched signal DATA3.

As the reset signal RST goes "H" at time T24, the outputs of the D flip-flops with load/hold 254 all go "L", whereby the determination signal TRMFIX go "L". Since the determination signal TRMFIX goes "L", the D flip-flops with load/hold 254 enter the load state, but the latch circuit control signals GATE0 to GATE4 output from the selector circuits 257 all go "L". Thus, during the period in which the reset signal RST is "H", the latch circuit control signals GATE0 to GATE4 are all "L", irrespective of the latched signals DATA0 to DATA4.

The reset signal RST goes "L" at time T25. Since the delayed input signal SIG is "L", the latched signals DATA0 to DATA4 remain "L" and the latch circuit control signals GATE0 to GATE4 remain "L".

Then, the input signal goes "H" and the delayed input signal SIG goes "H" at time T26. Since the delayed clock CLK2 rises immediately after time T26, the latch circuit 151 that latches the delayed input signal SIG on the delayed clock CLK2 latches the delayed input signal SIG at "H", whereby the latched signal DATA2 goes "H". Since the delayed clocks CLK0 to CLK1 rise before time T26, those latch circuits 151 that latch the delayed input signal SIG on the delayed clocks CLK0 to CLK1 latch the delayed input signal SIG at "L" before it goes "H", whereby the latched signals DATA0 to DATA1 are "L".

As the latched signal DATA2 goes "H", the determination signal TRMFIX goes "H". As the determination signal TRMFIX goes "H", the D flip-flops with load/hold 254 enter the hold state, whereby the outputs of the D flip-flops with load/hold 254 are fixed to the latched signals DATA0 to DATA4 immediately before the holding. Since the latched signals DATA0 to DATA1 are "L" and the latched signal DATA2 is "H", the determination signals TRM0 to TRM1 and TRM3 to TRM4 are "H" and the determination signal TRM2 is "L" because of the combination circuit of the logic elements 256. Moreover, since the determination signal TRMFIX is "H", the determination signals TRM0 to TRM4 are selected as the outputs of the selector circuit 257, whereby the latch circuit control signals GATE0 to GATE1 and GATE3 to GATE4 are "H" and the latch circuit control signal GATE2 is "L". The latched signals DATA0 to DATA4 to be output from the latch circuits 151 are controlled by the latch circuit control signals GATE0 to GATE4 so that the latched signals DATA0 to DATA1, DATA3 and DATA4 are fixed to "L", with only the latched signal DATA2 being valid. Since the D flip-flops with load/hold 254 are in the hold state, there will be no change to the determination signals TRM0 to TRM4, and hence the latch circuit control signals GATE0 to GATE4, even if the latched signals DATA0 to DATA4 later transition. Thereafter, the finalized input signal DATA transitions in synchronism with the latched signal DATA2.

Then, as the input signal goes "L" and the delayed input signal SIG goes "L" at time T27, the latched signal DATA2 goes "L" at a point in time as shown in the figure. The finalized input signal DATA goes "L" in synchronism with the latched signal DATA2.

Although the latched signal DATA3 and the latched signal DATA2 are selected in the illustrated example, any other latched signals may be selected depending on the timing of the input signal. In other words, the input signal can be latched on one of the delayed clocks CLK0 to CLK4, no matter when the input signal is input. The precision of the timing of latching the input signal can be improved by increasing the number of delayed clocks to be generated.

With the provision of the timing adjustment interface 202 having such a circuit configuration, it is possible to detect the first transition of the input signal to automatically determine the timing at which to latch the input signal such that the input signal is prevented from being determined erroneously due to the phase difference between the input signal and the clock, without requiring a complicated clock test sequence for the phase adjustment between the input signal and the clock or a sequencer circuit for realizing the clock test and without performing a clock test operation of transitioning the input signal in synchronism with the clock.

Embodiment 3

Figure 7:
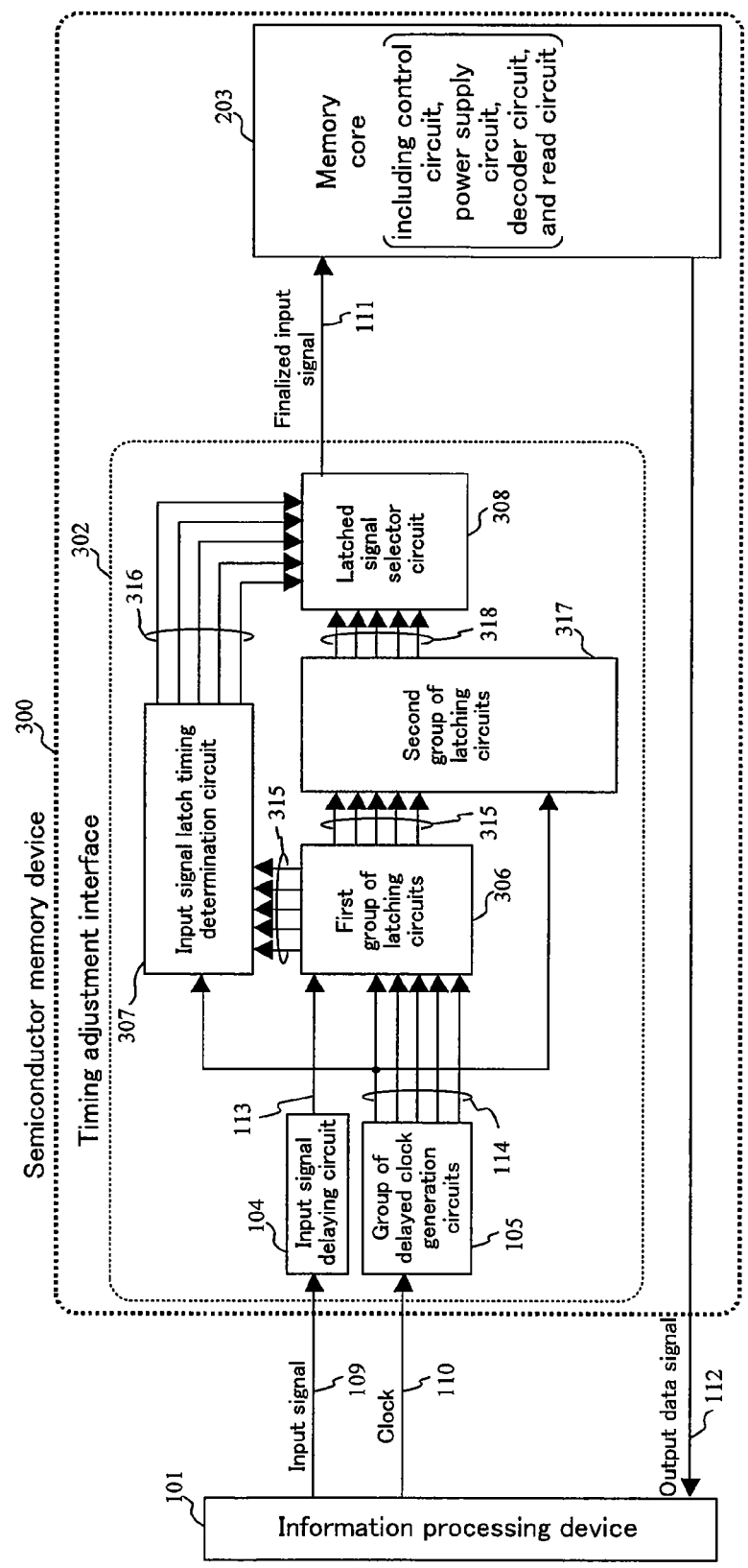
FIG. 7 is a schematic block diagram showing a configuration of a part of a semiconductor memory device 300 according to Embodiment 3 of the present invention.

FIG. 7 is a schematic block diagram showing a configuration of a part of a semiconductor memory device 300 according to Embodiment 3 of the present invention.

The semiconductor memory device 300 and the information processing device 101 for controlling the semiconductor memory device 300 are connected to each other by the input signal 109, the clock 110, and the output data signal 112.

The semiconductor memory device 300 includes a timing adjustment interface 302 and the memory core 203. The timing adjustment interface 302 and the memory core 203 are connected to each other by the finalized input signal 111.

The memory core 203 includes a control circuit, a power supply circuit, a decoder circuit and a read circuit for operating the memory core 203.

The timing adjustment interface 302 includes the input signal delaying circuit 104, the group of delayed clock generation circuits 105, a first group of latching circuits 306, a second group of latching circuits 317, an input signal latch timing determination circuit 307, and a latched signal selector circuit 308.

The input signal delaying circuit 104 delays the input signal 109 to output the delayed input signal 113 to the first group of latching circuits 306.

The group of delayed clock generation circuits 105 delays the input clock 110 to output n (n is an integer) delayed clocks 114 of different amounts of delay to the first group of latching circuits 306, the second group of latching circuits 317, and the input signal latch timing determination circuit 307.

The first group of latching circuits 306 latches the delayed input signal 113 on the n delayed clocks 114 to output first latched signals 315. The first latched signals 315 are input to the second group of latching circuits 317 and to the input signal latch timing determination circuit 307.

The input signal latch timing determination circuit 307 compares the first latched signals 315 with one another, and latches the comparison results on one of the delayed clocks 114 with the shortest delay time to thereby output determination signals 316. The determination signals 316 are input to the latched signal selector circuit 308.

The second group of latching circuits 317 latches the first latched signals 315 output from the first group of latching circuits 306 on one of the delayed clocks 114 with the shortest delay time to thereby output a second latched signal 318 to the latched signal selector circuit 308.

The latched signal selector circuit 308 controls and integrates the second latched signals 318 received from the second group of latching circuits 317 into a single finalized input signal 111, based on the determination signals 316 output from the input signal latch timing determination circuit 307.

Figure 8:
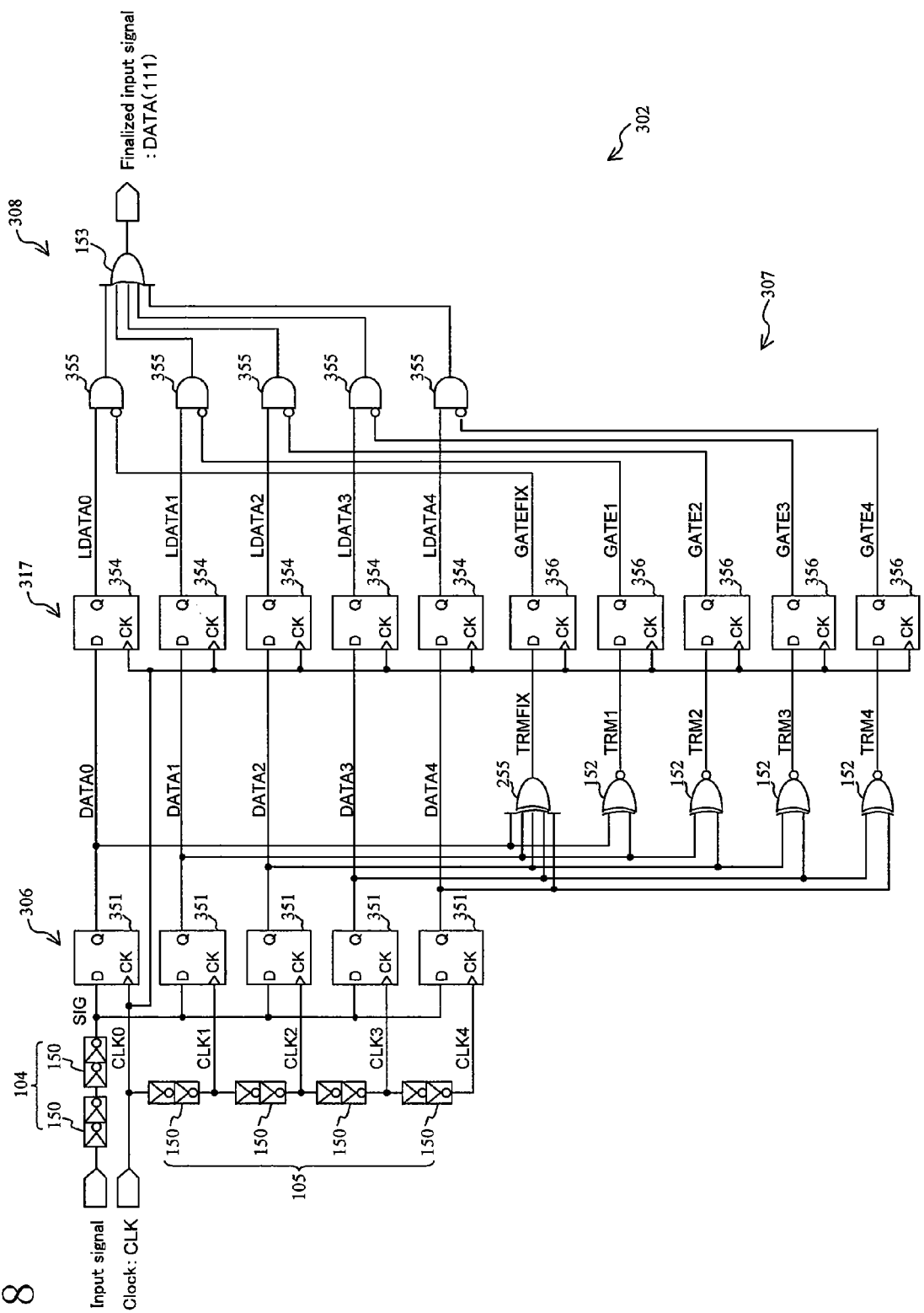
FIG. 8 is a circuit diagram showing a configuration of a timing adjustment interface 302 according to Embodiment 3 of the present invention.

FIG. 8 is a circuit diagram showing a specific configuration of the timing adjustment interface 302 where n=5.

The input signal delaying circuit 104 includes two delay sections 150 for delaying the input signal 109 to output a delayed input signal SIG (the delayed input signal 113).

The group of delayed clock generation circuits 105 include the delay sections 150 connected in series for receiving an input clock CLK to output delayed clocks CLK0 to CLK4 (the delayed clocks 114) of different delay times. The delay sections 150 of the input signal delaying circuit 104 and the group of delayed clock generation circuits 105 are not limited to any particular means, and may be, for example, a plurality of inverter circuits connected in series so as to provide an intended delay time.

The first group of latching circuits 306 include five latch circuits 351 for latching the delayed input signal SIG on the delayed clocks CLK0 to CLK4 to output the first latched signals DATA0 to DATA4 (the first latched signals 315), respectively.

The input signal latch timing determination circuit 307 includes four EX-NOR circuits 152, the EX-OR circuit 255, and five latch circuits (comparison signal latching circuits 356). The EX-NOR circuits 152 receive different pairs of adjacent ones of the first latched signals DATA0 to DATA4 to output comparison signals TRM1 to TRM4. The EX-OR circuit 255 receives all the first latched signals DATA0 to DATA4 to output a comparison signal TRMFIX. The comparison signal TRMFIX is "L" when the first latched signals DATA0 to DATA4 are all of the same logical value, and is "H" otherwise. The comparison signal latching circuits 356 latch the comparison signal TRMFIX and the comparison signals TRM1 to TRM4 on the delayed clock CLK0 to output a determination signal GATEFIX and determination signals GATE1 to GATE4.

The second group of latching circuits 317 include five latch circuits (second latch circuits 354) for latching the first latched signals DATA0 to DATA4 on the delayed clock CLK0 to output second latched signals LDATA0 to LDATA4, respectively.

The latched signal selector circuit 308 includes five logic elements 355 and the OR circuit 153. The determination signal GATEFIX controls the second latched signal LDATA0, and the determination signals GATE1 to GATE4 control the second latched signals LDATA1 to LDATA4, and the signals are integrated into one by the OR circuit 153. Specifically, when any of the determination signal GATEFIX and the determination signals GATE1 to GATE4 is "H", the output of the corresponding latch circuit 354 is kept "L", irrespective of the values of the second latched signals LDATA0 to LDATA4. Thus, only one of the second latched signals LDATA0 to LDATA4 corresponding to one of the determination signal GATEFIX and the determination signals GATE1 to GATE4 that is "L" is valid, and the finalized input signal DATA transitions according to the one of the second latched signals LDATA0 to LDATA4.

Figure 9:
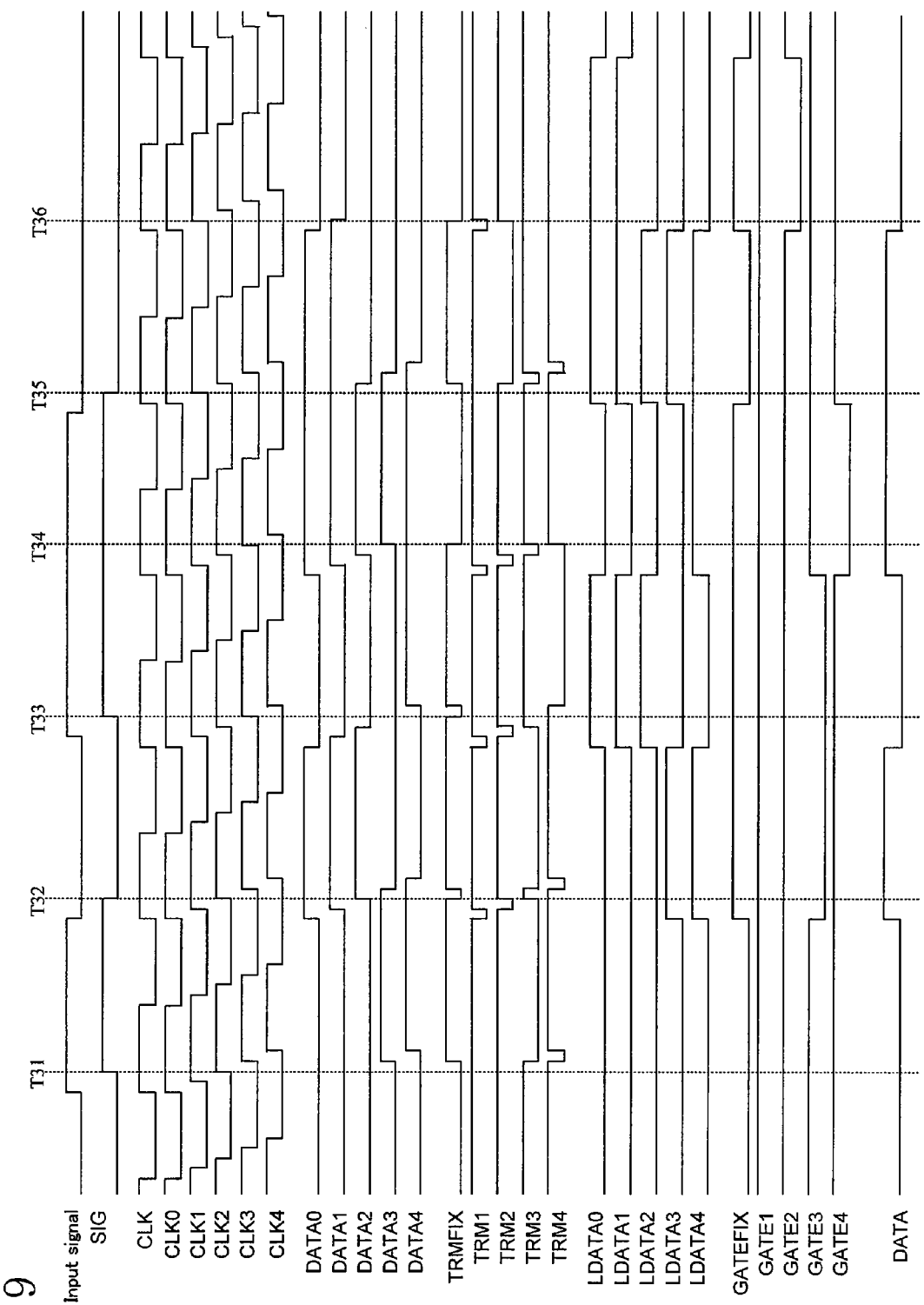
FIG. 9 is a timing diagram showing a timing adjustment operation according to Embodiment 3 of the present invention.

FIG. 9 shows waveforms during a timing adjustment operation to be performed with a circuit configuration shown in FIG. 8.

First, the input signal is "L", and the first latched signals DATA0 to DATA4 and the second latched signals LDATA0 to LDATA4 are "L", whereby the finalized input signal DATA is "L". The comparison signals TRM1 to TRM4 are "H", and the comparison signal TRMFIX is "L". The determination signal GATEFIX is "L", and the determination signals GATE1 to GATE4 are "H".

The input signal goes "H", and the delayed input signal SIG goes "H" at time T31. Since the delayed clocks CLK3 and CLK4 rise after time T31, those latch circuits 351 that latch the delayed input signal SIG on the delayed clocks CLK3 and CLK4 latch the delayed input signal SIG at "H", whereby the first latched signals DATA3 and DATA4 go "H" at respective points in time as shown in the figure. Since the delayed clocks CLK0 to CLK2 rise before time T31, those latch circuits 351 that latch the delayed input signal SIG on the delayed clocks CLK0 to CLK2 latch the delayed input signal SIG at "L" before it goes "H", whereby the first latched signals DATA0 to DATA2 are "L".

After the latch circuit 351 that latches the delayed input signal SIG on the delayed clock CLK4 latches the delayed input signal SIG after time T31, the first latched signals DATA0 to DATA2 are of the same logical value, the first latched signals DATA3 and DATA4 are of the same logical value, and the first latched signals DATA2 and DATA3 are of different logical values, whereby the comparison signals TRM1 to TRM2 and TRM4 are "H", the comparison signal TRM3 is "L", and the comparison signal TRMFIX is "H".

Then, at the next rising edge of the delayed clock CLK0, the first latched signals DATA0 to DATA4 are latched by the second latch circuits 354, whereby the second latched signals LDATA0 to LDATA2 are "L" and the second latched signals LDATA3 to LDATA4 are "H". The comparison signal TRMFIX and the comparison signals TRM1 to TRM4 are latched by the comparison signal latching circuits 356, whereby the determination signal GATEFIX and the determination signals GATE1 to GATE2 and GATE4 are "H" and the determination signal GATE3 is "L". At this point, the second latched signal LDATA3 is valid, and the finalized input signal DATA goes "H" in synchronism with the second latched signal LDATA3.

Then, the input signal goes "L", and the delayed input signal SIG goes "L" at time T32. Since the delayed clocks CLK3 and CLK4 rise after time T32, those latch circuits 351 that latch the delayed input signal SIG on the delayed clocks CLK3 and CLK4 latch the delayed input signal SIG at "L", whereby the first latched signals DATA3 and DATA4 go "L" at respective points in time as shown in the figure. Since the delayed clocks CLK0 to CLK2 rise before time T32, those latch circuits 351 that latch the delayed input signal SIG on the delayed clocks CLK0 to CLK2 latch the delayed input signal SIG at "H", whereby the first latched signals DATA0 to DATA2 go "H".

After the latch circuit 351 that latches the delayed input signal SIG on the delayed clock CLK4 latches the delayed input signal SIG after time T32, the first latched signals DATA0 to DATA2 are of the same logical value, the first latched signals DATA3 and DATA4 are of the same logical value, and the first latched signals DATA2 and DATA3 are of different logical values, whereby the comparison signals TRM1 to TRM2 and TRM4 are "H", the comparison signal TRM3 is "L", and the comparison signal TRMFIX is "H".

Then, at the next rising edge of the delayed clock CLK0, the first latched signals DATA0 to DATA4 are latched by the second latch circuits 354, whereby the second latched signals LDATA0 to LDATA2 are "H" and the second latched signals LDATA3 to LDATA4 are "L". The comparison signal TRMFIX and the comparison signals TRM1 to TRM4 are latched by the comparison signal latching circuits 356, whereby the determination signal GATEFIX and the determination signals GATE1 to GATE2 and GATE4 are "H" and the determination signal GATE3 is "L". At this point, the second latched signal LDATA3 is valid, and the finalized input signal DATA goes "H" in synchronism with the second latched signal LDATA3.

Then, the input signal goes "H", and the delayed input signal SIG goes "H" at time T33. Since the delayed clock CLK4 rises after time T33, the latch circuit 351 that latches the delayed input signal SIG on the delayed clock CLK4 latches the delayed input signal SIG at "H", whereby the first latched signal DATA4 goes "H" at a point in time as shown in the figure. Since the delayed clocks CLK0 to CLK3 rise before time T33, those latch circuits 351 that latch the delayed input signal SIG on the delayed clocks CLK0 to CLK3 latch the delayed input signal SIG at "L", whereby the first latched signals DATA0 to DATA3 are "L".

After the latch circuit 351 that latches the delayed input signal SIG on the delayed clock CLK4 latches the delayed input signal SIG after time T33, the first latched signals DATA0 to DATA3 are of the same logical value, and the first latched signals DATA3 and DATA4 are of different logical values, whereby the comparison signals TRM1 to TRM3 and TRMFIX are "H" and the comparison signal TRM4 is "L".

Then, at the next rising edge of the delayed clock CLK0, the first latched signals DATA0 to DATA4 are latched by the second latch circuits 354, whereby the second latched signals LDATA0 to LDATA3 are "L" and the second latched signal LDATA4 is "H". The comparison signal TRMFIX and the comparison signals TRM1 to TRM4 are latched by the comparison signal latching circuits 356, whereby the determination signal GATEFIX and the determination signals GATE1 to GATE3 are "H" and the determination signal GATE4 is "L". At this point, the second latched signal LDATA4 is valid, and the finalized input signal DATA goes "H" in synchronism with the second latched signal LDATA4.

Then, the input signal remains "H", and the delayed input signal SIG is "H" at time T34. Since the delayed clock CLK4 rises after time T34, the latch circuit 351 that latches the delayed input signal SIG on the delayed clock CLK4 latches the delayed input signal SIG at "H", whereby the first latched signal DATA4 remains "H". Since the delayed clocks CLK0 to CLK3 rise before time T34, those latch circuits 351 that latch the delayed input signal SIG on the delayed clocks CLK0 to CLK3 latch the delayed input signal SIG at "H", whereby the first latched signals DATA0 to DATA3 go "H".

After the latch circuit 351 that latches the delayed input signal SIG on the delayed clock CLK4 latches the delayed input signal SIG after time T34, the first latched signals DATA0 to DATA4 will be of the same logical value, whereby the comparison signals TRM1 to TRM4 are "H" and the comparison signal TRMFIX is "L".

Then, at the next rising edge of the delayed clock CLK0, the first latched signals DATA0 to DATA4 are latched by the second latch circuits 354, whereby the second latched signals LDATA0 to LDATA4 are "H". The comparison signal TRM-FIX and the comparison signals TRM1 to TRM4 are latched by the comparison signal latching circuits 356, whereby the determination signals GATE1 to GATE4 are "H" and the determination signal GATEFIX is "L". At this point, the second latched signal LDATA0 is valid, and the finalized input signal DATA goes "H" in synchronism with the second latched signal LDATA0.

Then, the input signal goes "L", and the delayed input signal SIG goes "L" at time T35. Since the delayed clocks CLK2 to CLK4 rise after time T35, those latch circuits 351 that latch the delayed input signal SIG on the delayed clocks CLK2 to CLK4 latch the delayed input signal SIG at "L", whereby the first latched signals DATA2 to DATA4 go "L" at respective points in time as shown in the figure. Since the delayed clocks CLK0 to CLK1 rise before time T35, those latch circuits 351 that latch the delayed input signal SIG on the delayed clocks CLK0 to CLK1 latch the delayed input signal SIG at "H", whereby the first latched signals DATA0 to DATA1 go "H".

After the latch circuit 351 that latches the delayed input signal SIG on the delayed clock CLK4 latches the delayed input signal SIG after time T35, the first latched signals DATA0 to DATA1 are of the same logical value, the first latched signals DATA2 to DATA4 are of the same logical value, and the first latched signals DATA1 and DATA2 are of different logical values, whereby the comparison signals TRM1, TRM3 to TRM4 and TRMFIX are "H" and the comparison signal TRM2 is "L".

Then, at the next rising edge of the delayed clock CLK0, the first latched signals DATA0 to DATA4 are latched by the second latch circuits 354, whereby the second latched signals LDATA0 to LDATA1 are "H" and the second latched signals LDATA2 to LDATA4 are "L". The comparison signal TRM-FIX and the comparison signals TRM1 to TRM4 are latched by the comparison signal latching circuits 356, whereby the determination signal GATEFIX and the determination signals GATE1 to GATE3 and GATE4 are "H" and the determination signal GATE2 is "L". At this point, the second latched signal LDATA2 is valid, and the finalized input signal DATA goes "H" in synchronism with the second latched signal LDATA2.

Then, the input signal remains "L", and the delayed input signal SIG is "L" at time T36. Since the delayed clocks CLK2 to CLK4 rise after time T36, those latch circuits 351 that latch the delayed input signal SIG on the delayed clocks CLK2 to CLK4 latch the delayed input signal SIG at "L", whereby the first latched signals DATA2 to DATA4 remain "L". Since the delayed clocks CLK0 to CLK1 rise before time T36, those latch circuits 351 that latch the delayed input signal SIG on the delayed clocks CLK0 to CLK1 latch the delayed input signal SIG at "L", whereby the first latched signals DATA0 to DATA1 go "L".

After the latch circuit 351 that latches the delayed input signal SIG on the delayed clock CLK4 latches the delayed input signal SIG after time T36, the first latched signals DATA0 to DATA4 will be of the same logical value, whereby the comparison signals TRM1 to TRM4 are "H" and the comparison signal TRMFIX is "L".

Then, at the next rising edge of the delayed clock CLK0, the first latched signals DATA0 to DATA4 are latched by the second latch circuits 354, whereby the second latched signals LDATA0 to LDATA4 are "L". The comparison signal TRM-FIX and the comparison signals TRM1 to TRM4 are latched by the comparison signal latching circuits 356, whereby the determination signals GATE1 to GATE4 are "H" and the determination signal GATEFIX is "L". At this point, the second latched signal LDATA0 is valid, and the finalized input signal DATA goes "L" in synchronism with the second latched signal LDATA0.

As described above, even when the semiconductor memory device is in operation, it is possible to constantly detect the transitions of the input signal to determine the determination signals GATE0 to GATE4 and GATEFIX. One of the second latched signals LDATA0 to LDATA4 becomes valid based on the determination signals GATE0 to GATE4 and GATEFIX, and the finalized input signal DATA transitions in synchronism with the valid one of the second latched signals LDATA0 to LDATA4.

In other words, the input signal can be latched on one of the delayed clocks CLK0 to CLK4, no matter when the input signal is input.

The precision of the timing of latching the input signal can be improved by increasing the number of delayed clocks to be generated.

With the provision of the timing adjustment interface 302 having such a circuit configuration, even when the semiconductor memory device is in operation, it is possible to constantly detect the transitions of the input signal to automatically determine the timing at which to latch the input signal such that the input signal is prevented from being determined erroneously due to the phase difference between the input signal and the clock, without requiring a complicated clock test sequence for the phase adjustment between the input signal and the clock or a sequencer circuit for realizing the clock test and without performing a clock test operation of transitioning the input signal in synchronism with the clock.

Embodiment 4

Figure 10:
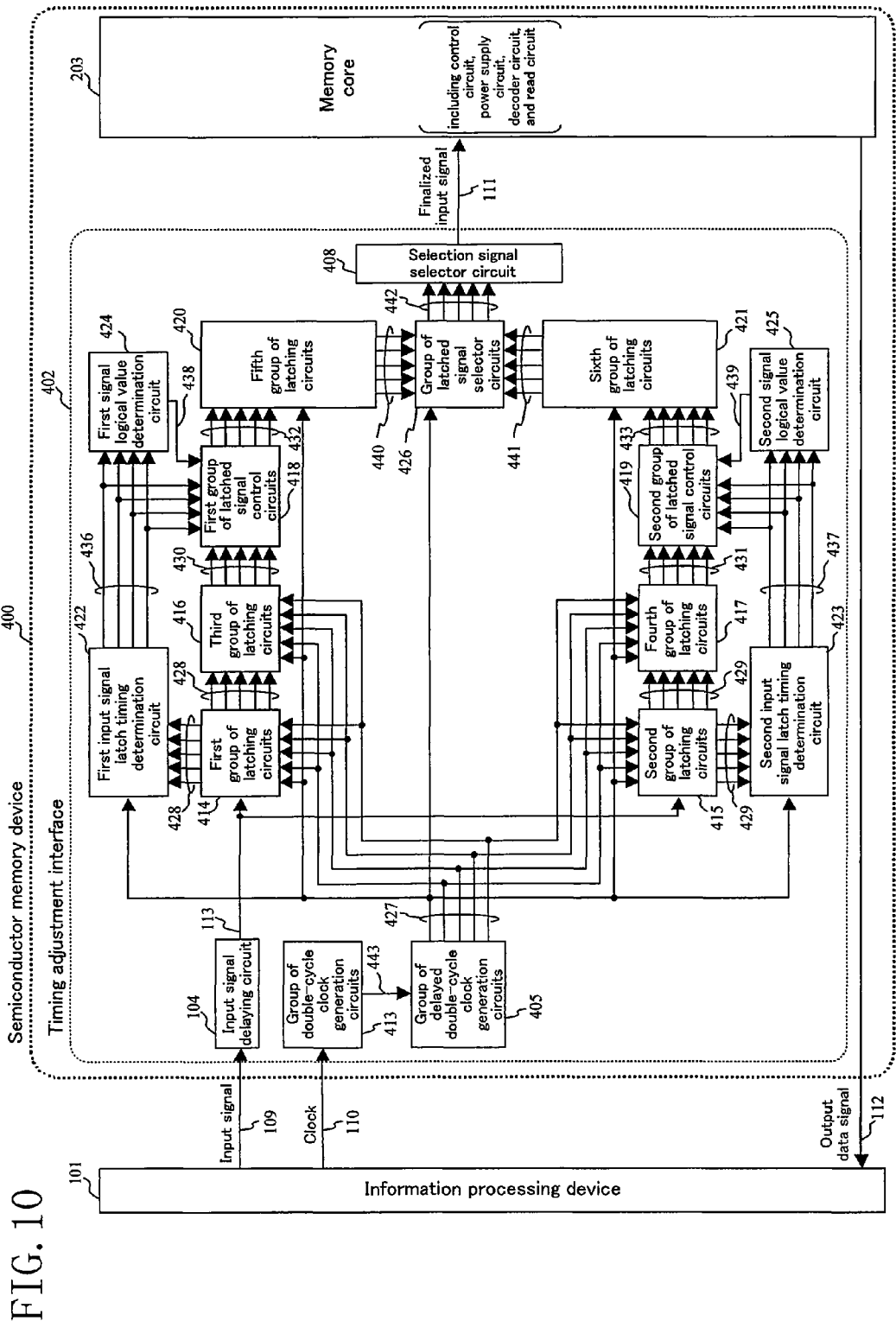
FIG. 10 is schematic block diagram showing a configuration of a part of a semiconductor memory device 400 according to Embodiment 4 of the present invention.

FIG. 10 is a schematic block diagram showing a configuration of a part of a semiconductor memory device 400 according to Embodiment 4 of the present invention.

The semiconductor memory device 400 and the information processing device 101 for controlling the semiconductor memory device 400 are connected to each other by the input signal 109, the clock 110, and the output data signal 112.

The semiconductor memory device 400 includes a timing adjustment interface 402 and the memory core 203. The timing adjustment interface 402 and the memory core 203 are connected to each other by the finalized input signal 111.

The memory core 203 includes a control circuit, a power supply circuit, a decoder circuit, and a read circuit for operating the memory core 203.

The timing adjustment interface 402 includes the input signal delaying circuit 104, a group of double-cycle clock generation circuits 413, a group of double-cycle delayed clock generation circuits 405, a first group of latching circuits 414, a second group of latching circuits 415, a third group of latching circuits 416, a fourth group of latching circuits 417, a first group of latched signal control circuits 418, a second group of latched signal control circuits 419, a fifth group of latching circuits 420, a sixth group of latching circuits 421, a first input signal latch timing determination circuit 422, a second input signal latch timing determination circuit 423, a first signal logical value determination circuit 424, a second signal logical value determination circuit 425, a group of latched signal selector circuits 426, and a selection signal selector circuit 408.

The input signal delaying circuit 104 delays the input signal 109 to output the delayed input signal 113 to the first group of latching circuits 414 and the second group of latching circuits 415.

The group of double-cycle clock generation circuits 413 receive the input clock 110 to output a double-cycle clock 443 having a cycle that is twice as long as that of the clock 110 to the group of double-cycle delayed clock generation circuits 405.

The group of double-cycle delayed clock generation circuits 405 delay the received double-cycle clock 443 to output n (n is an integer) double-cycle delayed clocks 427 of different amounts of delay to the first group of latching circuits 414, the second group of latching circuits 415, the third group of latching circuits 416, the fourth group of latching circuits 417, the fifth group of latching circuits 420, the sixth group of latching circuits 421, the first input signal latch timing determination circuit 422, the second input signal latch timing determination circuit 423, and the group of latched signal selector circuits 426.

The first group of latching circuits 414 latch the delayed input signal 113 on n double-cycle delayed clocks 427 to output first latched signals 428. The first latched signals 428 are input to the third group of latching circuits 416 and the first input signal latch timing determination circuit 422.

The third group of latching circuits 416 latch the first latched signals 428 on n double-cycle delayed clocks 427 to output n third latched signals 430, respectively. The third latched signals 430 are input to the first group of latched signal control circuits 418.

The first input signal latch timing determination circuit 422 compares the first latched signals 428 with one another, and latches the comparison results on the double-cycle delayed clocks 427 to thereby output first determination signals 436. The first determination signals 436 are input to the first group of latched signal control circuits 418 and the first signal logical value determination circuit 424.

The first signal logical value determination circuit 424 determines the logical value of the first determination signals 436 to output the determination result as a first logical value determination signal 438 to the first group of latched signal control circuits 418.

The first group of latched signal control circuits 418 control the third latched signals 430 based on the first determination signals 436 and the first logical value determination signal 438 to output first controlled latched signals 432. The first controlled latched signals 432 are input to the fifth group of latching circuits 420.

The fifth group of latching circuits 420 latch the first controlled latched signals 432 on n double-cycle delayed clocks 427 to output n fifth latched signals 440, respectively. The fifth latched signals 440 are input to the group of latched signal selector circuits 426.

The second group of latching circuits 415 latch the delayed input signal 113 on n double-cycle delayed clocks 427 to output second latched signals 429. The second latched signals 429 are input to the fourth group of latching circuits 417 and the second input signal latch timing determination circuit 423.

The fourth group of latching circuits 417 latch the second latched signal 429 on n double-cycle delayed clocks 427 to output n fourth latched signals 431, respectively. The fourth latched signals 431 are input to the second group of latched signal control circuits 419.

The second input signal latch timing determination circuit 423 compares the second latched signals 429 with one another, and latches the comparison result on the double-cycle delayed clock 427 to thereby output a second determination signals 437. The second determination signals 437 are input to the second group of latched signal control circuits 419 and the second signal logical value determination circuit 425.

The second signal logical value determination circuit 425 determines the logical value of the second determination signals 437 to output the determination result as a second logical value determination signal 439 to the second group of latched signal control circuits 419.

The second group of latched signal control circuits 419 control the fourth latched signals 431 based on the second determination signals 437 and the second logical value determination signal 439 to output second controlled latched signals 433. The second controlled latched signals 433 are input to the sixth group of latching circuits 421.

The sixth group of latching circuits 421 latch the second controlled latched signals 433 on n double-cycle delayed clocks 427 to output n sixth latched signals 441, respectively. The sixth latched signals 441 are input to the group of latched signal selector circuits 426.

Based on the double-cycle delayed clock 427, the group of latched signal selector circuits 426 selectively output either the fifth latched signals 440 or the sixth latched signals 441 as selected latched signals 442. The selected latched signals 442 are input to the selection signal selector circuit 408.

The selection signal selector circuit 408 integrates the input selected latched signals 442 into a single finalized input signal 111.

Figure 11:
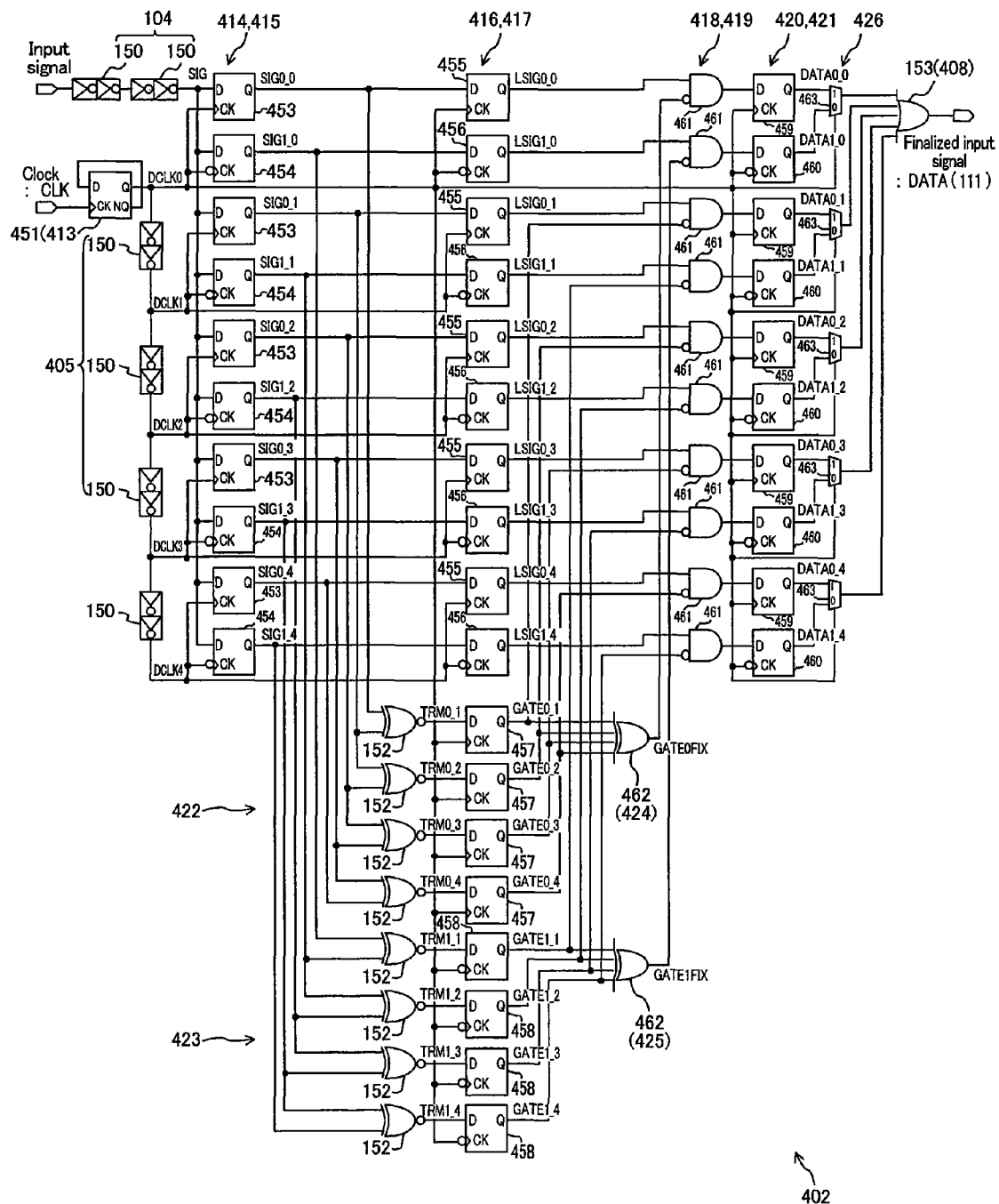
FIG. 11 is a circuit diagram showing a configuration of a timing adjustment interface 402 according to Embodiment 4 of the present invention.

FIG. 11 is a circuit diagram showing a specific configuration of the timing adjustment interface 402 where n=5.

The input signal delaying circuit 104 includes two delay sections 150 for delaying the input signal 109 to output the delayed input signal SIG (the delayed input signal 113).

The group of double-cycle clock generation circuits 413 include a latch circuit 451, and the output NQ of the latch circuit 451 is connected to the input D. With such a configuration, the output is switched at the rising edges of the clock CLK, thus generating a clock (the double-cycle clock 443) having a cycle that is twice as long as that of the input clock CLK.

The group of double-cycle delayed clock generation circuits 405 include the delay sections 150 connected in series for receiving the double-cycle clock 443 to output double-cycle delayed clocks DCLK0 to DCLK4 (the double-cycle delayed clocks 427) of different delay times. The delay sections 150 of the input signal delaying circuit 104 and the group of double-cycle delayed clock generation circuits 405 are not limited to any particular means, and may be, for example, a plurality of inverter circuits connected in series so as to provide an intended delay time.

The first group of latching circuits 414 include five latch circuits 453 for latching the delayed input signal SIG at the rising edges of the double-cycle delayed clocks DCLK0 to DCLK4 to output first latched signals SIG0_0 to SIG0_4 (the first latched signals 428), respectively.

The third group of latching circuits 416 include five latch circuits 455 for latching the first latched signals SIG0_0 to SIG0_4 at the rising edges of the double-cycle delayed clocks DCLK0 to DCLK4 to output third latched signals LSIG0_0 to LSIG0_4 (the third latched signals 430), respectively.

The first input signal latch timing determination circuit 422 includes four EX-NOR circuits 152 and four latch circuits 457. The EX-NOR circuits 152 receive different pairs of adjacent ones of the first latched signals SIG0_0 to SIG0_4 to output signals TRM0_1 to TRM0_4. The signals TRM0_1 to TRM0_4 are latched by the latch circuits 457 at the rising edge of the double-cycle delayed clock DCLK0 to thereby output first determination signals GATE0_1 to GATE0_4 (the first determination signals 436).

The first signal logical value determination circuit 424 includes an EX-OR circuit 462. The EX-OR circuit 462 receives the first determination signals GATE0_1 to GATE0_4 to output a first logical value determination signal GATE0FIX (the first logical value determination signal 438). The first logical value determination signal GATE0FIX is "L" when the first determination signals GATE0_1 to GATE0_4 are all of the same logical value, and is "H" otherwise.

The first group of latched signal control circuits 418 include five logic elements 461. The logic elements 461 receive the third latched signals LSIG0_0 to LSIG0_4, the first logical value determination signal GATE0FIX and the first determination signals GATE0_1 to GATE0_4 to output first controlled latched signals (the first controlled latched signals 432).

The fifth group of latching circuits 420 include five latch circuits 459 for latching the first controlled latched signals from the logic elements 461 at the rising edge of the double-cycle delayed clock DCLK0 to output fifth latched signals DATA0_0 to DATA0_4 (the fifth latched signals 440), respectively.

The second group of latching circuits 415 include five latch circuits 454 for latching the delayed input signal SIG at the falling edges of the double-cycle delayed clocks DCLK0 to DCLK4 to output second latched signals SIG1_0 to SIG1_4 (the second latched signals 429), respectively.

The fourth group of latching circuits 417 include five latch circuits 456 for latching the second latched signals SIG1_0 to SIG1_4 at the falling edges of the double-cycle delayed clocks DCLK0 to DCLK4 to output fourth latched signals LSIG1_0 to LSIG1_4 (the fourth latched signals 431), respectively.

The second input signal latch timing determination circuit 423 includes four EX-NOR circuits 152 and four latch circuits 458. The EX-NOR circuits 152 receive different pairs of adjacent ones of the second latched signals SIG1_0 to SIG1_4 to output signals TRM1_1 to TRM1_4. The signals TRM1_1 to TRM1_4 are latched by the latch circuits 458 at the falling edge of the double-cycle delayed clock DCLK0 to thereby output second determination signals GATE1_1 to GATE1_4 (the second determination signals 437).

The second signal logical value determination circuit 425 includes the EX-OR circuit 462. The EX-OR circuit 462 receives the second determination signals GATE1_1 to GATE1_4 to output a second logical value determination signal GATE1FIX (the second logical value determination signal 439). The second logical value determination signal GATE1FIX is "L" when the second determination signals GATE1_1 to GATE1_4 are all of the same logical value, and is "H" otherwise.

The second group of latched signal control circuits 419 include five logic elements 461. The logic elements 461 receive fourth latched signals LSIG1_0 to LSIG1_4, the second logical value determination signal GATE1FIX and the second determination signals GATE1_1 to GATE1_4 to output second controlled latched signals (the second controlled latched signals 433).

The sixth group of latching circuits 421 include five latch circuits 460 for latching the second controlled latched signals from the logic elements 461 at the falling edge of the double-cycle delayed clock DCLK0 to output sixth latched signals DATA1_0 to DATA1_4 (the sixth latched signals 441), respectively.

The group of latched signal selector circuits 426 include five selectors 463 receiving the first determination signals GATE0_1 to GATE0_4 and the second determination signals GATE1_1 to GATE1_4. Based on the double-cycle delayed clock DCLK0, the selectors 463 selectively output either the first determination signals GATE0_1 to GATE0_4 or the second determination signals GATE1_1 to GATE1_4 as the selected latched signals (the selected latched signals 442).

The selected latched signals output from the group of latched signal selector circuits 426 are input to the OR circuit 153 to be output as the finalized input signal DATA (the finalized input signal 111).

Figure 12:
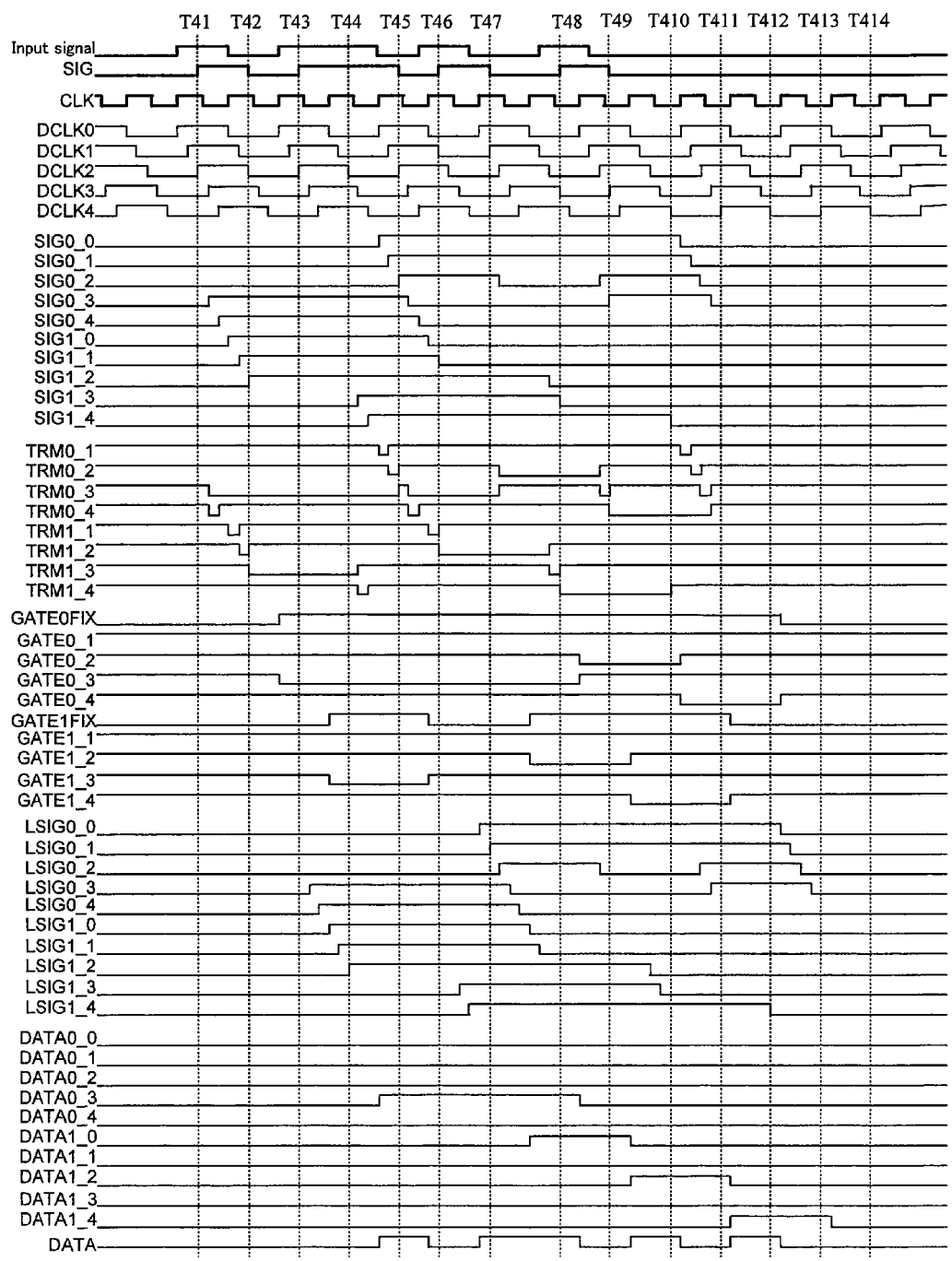
FIG. 12 is a timing diagram showing a timing adjustment operation according to Embodiment 4 of the present invention.

FIG. 12 shows waveforms during a timing adjustment operation to be performed with a circuit configuration shown in FIG. 11.

First, the input signal is "L", and the first latched signals SIG0_0 to SIG0_4, the second latched signals SIG1_0 to SIG1_4, the third latched signals LSIG0_0 to LSIG0_4, the fourth latched signals LSIG1_0 to LSIG1_4, the fifth latched signals DATA0_0 to DATA0_4, the sixth latched signals DATA1_0 to DATA1_4, and the signal DATA are "L". The outputs TRM0_1 to TRM0_4 and TRM1_1 to TRM1_4, the first determination signals GATE0_1 to GATE0_4, and the second determination signals GATE1_1 to GATE1_4 are "H", and the first logical value determination signal GATE0FIX and the second logical value determination signal GATE1FIX are "L". Since the first determination signals GATE0_1 to GATE0_4 are "H" and the first logical value determination signal GATE0FIX is "L", the outputs of the logic elements 461 receiving the third latched signals LSIG0_1 to LSIG0_4 are "L", and the output of the logic element 461 receiving the third latched signal LSIG0_0 is valid. Similarly, since the second determination signals GATE1_1 to GATE1_4 are "H" and the second logical value determination signal GATE1FIX is "L", the outputs of the logic elements 461 receiving the fourth latched signals LSIG1_1 to LSIG1_4 are "L", and the output of the logic element 461 receiving the fourth latched signal LSIG1_0 is valid.

Around Time T41

At the rising edge of the double-cycle delayed clock DCLK0, the outputs of the logic elements 461 receiving the third latched signals LSIG0_0 to LSIG0_4 are latched by the latch circuits 459, whereby the fifth latched signals DATA0_0 to DATA0_4 are "L". At this point, as the double-cycle delayed clock DCLK0 goes "H", the fifth latched signals DATA0_0 to DATA0_4 are output from the corresponding selectors 463, but the finalized output signal DATA will remain "L".

At the rising edges of the double-cycle delayed clocks DCLK0 to DCLK4, the first latched signals SIG0_0 to SIG0_4 are latched by the latch circuits 455, whereby the third latched signals LSIG0_0 to LSIG0_4 are "L".

At the rising edge of the double-cycle delayed clock DCLK0, the outputs TRM0_1 to TRM0_4 of the EX-NOR circuits 152 are latched by the latch circuits 457, whereby the first determination signals GATE0_1 to GATE0_4 are "H". Since the first determination signals GATE0_1 to GATE0_4 are all of the same logical value, the first logical value determination signal GATE0FIX is "L". Since the first determination signals GATE0_1 to GATE0_4 are "H" and the first logical value determination signal GATE0FIX is "L", the outputs of the logic elements 461 receiving the third latched signals LSIG0_1 to LSIG0_4 are "L", and the output of the logic element 461 receiving the third latched signal LSIG0_0 is valid.

The input signal goes "H", and the delayed input signal SIG goes "H" at time T41. Since the double-cycle delayed clocks DCLK3 and DCLK4 rise after time T41, those latch circuits 453 that latch the delayed input signal SIG at the rising edges of the double-cycle delayed clocks DCLK3 and DCLK4 latch the delayed input signal SIG at "H", and the first latched signals SIG0_3 and SIG0_4 go "H" at a point in time as shown in the figure. Since the double-cycle delayed clocks DCLK0 to DCLK2 rise before time T41, those latch circuits 453 that latch the delayed input signal SIG at the rising edges of the double-cycle delayed clocks DCLK0 to DCLK2 latch the delayed input signal SIG at "L" before it goes "H", and the first latched signals SIG0_0 to SIG0_2 go "L" at respective points in time as shown in the figure.

After the latch circuit 453 that latches the delayed input signal SIG at the rising edge of the double-cycle delayed clock DCLK4 latches the delayed input signal SIG after time T41, the first latched signals SIG0_0 to SIG0_2 are of the same logical value, the first latched signals SIG0_3 and SIG0_4 are of the same logical value, and the first latched signals SIG0_2 and SIG0_3 are of different logical values, whereby the signals TRM0_1 to TRM0_2 and TRM0_4 are "H" and the signal TRM0_3 is "L".

Around Time T42

At the falling edge of the double-cycle delayed clock DCLK0, the outputs of the logic elements 461 receiving the fourth latched signals LSIG1_0 to LSIG1_4 are latched by the latch circuits 460, whereby the sixth latched signals DATA1_0 to DATA1_4 are "L". At this, point, as the double-cycle delayed clock DCLK0 goes "L", the sixth latched signals DATA1_0 to DATA1_4 are output from the corresponding selectors 463, but the finalized output signal DATA will remain "L".

At the falling edges of the double-cycle delayed clocks DCLK0 to DCLK4, the second latched signals SIG1_0 to SIG1_4 are latched by the latch circuits 456, whereby the fourth latched signals LSIG1_0 to LSIG1_4 are "L".

At the falling edge of the double-cycle delayed clock DCLK0, the outputs TRM1_1 to TRM1_4 of the EX-NOR circuits 152 are latched by the latch circuits 458, whereby the second determination signals GATE1_1 to GATE1_4 are "H". Since the second determination signals GATE1_1 to GATE1_4 are all of the same logical value, the second logical value determination signal GATE1FIX is "L". Since the second determination signals GATE1_1 to GATE1_4 are "H" and the second logical value determination signal GATE1FIX is "L", the outputs of the logic elements 461 receiving the fourth latched signals LSIG1_1 to LSIG1_4 are "L", and the output of the logic element 461 receiving the fourth latched signal LSIG1_0 is valid.

The input signal goes "L", and the delayed input signal SIG goes "L" at time T42. Since the double-cycle delayed clocks DCLK3 and DCLK4 fall after time T42, those latch circuits 454 that latch the delayed input signal SIG at the falling edges of the double-cycle delayed clocks DCLK3 and DCLK4 latch the delayed input signal SIG at "L", and the second latched signals SIG1_3 and SIG1_4 go "L" at respective points in time as shown in the figure. Since the double-cycle delayed clocks DCLK0 to DCLK2 fall before time T42, those latch circuits 454 that latch the delayed input signal SIG at the falling edges of the double-cycle delayed clocks DCLK0 to DCLK2 latch the delayed input signal SIG at "H", whereby the second latched signals SIG1_0 to SIG1_2 go "H".

After the latch circuit 454 that latches the delayed input signal SIG at the falling edge of the double-cycle delayed clock DCLK4 latches the delayed input signal SIG after time T42, the second latched signals SIG1_0 to SIG1_2 are of the same logical value, the second latched signals SIG1_3 and SIG1_4 are of the same logical value, and the second latched signals SIG1_2 and SIG1_3 are of different logical values, whereby the signals TRM1_1 to TRM1_2 and TRM1_4 are "H" and the signal TRM1_3 is "L".

Around Time T43

At the rising edge of the double-cycle delayed clock DCLK0, the outputs of the logic elements 461 receiving the third latched signals LSIG0_0 to LSIG0_4 are latched by the latch circuits 459, whereby the fifth latched signals DATA0_0 to DATA0_4 are "L". At this point, as the double-cycle delayed clock DCLK0 goes "H", the fifth latched signals DATA0_0 to DATA0_4 are output from the corresponding selectors 463, but the finalized output signal DATA will remain "L".

At the rising edges of the double-cycle delayed clocks DCLK0 to DCLK4, the first latched signals SIG0_0 to SIG0_4 are latched by the latch circuits 455, whereby the third latched signals LSIG0_0 to LSIG0_2 are "L" and the third latched signals LSIG0_3 to LSIG0_4 are "H".

At the rising edge of the double-cycle delayed clock DCLK0, the outputs TRM0_1 to TRM0_4 of the EX-NOR circuits 152 are latched by the latch circuits 457, whereby the first determination signals GATE0_1 to GATE0_2 and GATE0_4 are "H" and the first determination signal GATE0_3 is "L". Since the first determination signals GATE0_1 to GATE0_4 are not all of the same logical value, the first logical value determination signal GATE0FIX is "H". Since the first determination signals GATE0_1 to GATE0_2 and GATE0_4 are "H", the first determination signal GATE0_3 is "L" and the first logical value determination signal GATE0FIX is "H", the outputs of the logic elements 461 receiving the third latched signals LSIG0_0 to LSIG0_2 and LSIG0_4 are "L", and the output of the logic element 461 receiving the third latched signal LSIG0_3 is valid.

The input signal goes "H", and the delayed input signal SIG goes "H" at time T43. Since the double-cycle delayed clocks DCLK3 and DCLK4 rise after time T43, those latch circuits 453 that latch the delayed input signal SIG at the rising edges of the double-cycle delayed clocks DCLK3 and DCLK4 latch the delayed input signal SIG at "H", whereby the first latched signals SIG0_3 and SIG0_4 are "H". Since the double-cycle delayed clocks DCLK0 to DCLK2 rise before time T43, those latch circuits 453 that latch the delayed input signal SIG at the rising edges of the double-cycle delayed clocks DCLK0 to DCLK2 latch the delayed input signal SIG at "L", whereby the first latched signals SIG0_0 to SIG0_2 are "L".

After the latch circuit 453 that latches the delayed input signal SIG at the rising edge of the double-cycle delayed clock DCLK4 latches the delayed input signal SIG after time T43, the first latched signals SIG0_0 to SIG0_2 are of the same logical value, the first latched signals SIG0_3 and SIG0_4 are of the same logical value, and the first latched signals SIG0_2 and SIG0_3 are of different logical values, whereby the signals TRM0_1 to TRM0_2 and TRM0_4 are "H" and the signal TRM0_3 is "L".

Around Time T44

At the falling edge of the double-cycle delayed clock DCLK0, the outputs of the logic elements 461 receiving the fourth latched signals LSIG1_0 to LSIG1_4 are latched by the latch circuits 460, whereby the sixth latched signals DATA1_0 to DATA1_4 are "L". At this point, as the double-cycle delayed clock DCLK0 goes "L", the sixth latched signals DATA1_0 to DATA1_4 are output from the corresponding selectors 463, but the finalized output signal DATA will remain "L".

At the falling edges of the double-cycle delayed clocks DCLK0 to DCLK4, the second latched signals SIG1_0 to SIG1_4 are latched by the latch circuits 456, whereby the fourth latched signals LSIG1_0 to LSIG1_2 are "H" and the fourth latched signals LSIG1_3 to LSIG1_4 are "L".

At the falling edge of the double-cycle delayed clock DCLK0, the outputs TRM1_1 to TRM1_4 of the EX-NOR circuits 152 are latched by the latch circuits 458, whereby the second determination signals GATE1_1 to GATE1_2 and GATE1_4 are "H" and the second determination signal GATE1_3 is "L". Since the second determination signals GATE1_1 to GATE1_4 are not all of the same logical value, the second logical value determination signal GATE1FIX is "H". Since the second determination signals GATE1_1 to GATE1_2 and GATE1_4 are "H", the second determination signal GATE1_3 is "L", and the second logical value determination signal GATE1FIX is "H", the outputs of the logic elements 461 receiving the fourth latched signals LSIG1_0 to LSIG1_2 and LSIG1_4 are "L", and the output of the logic element 461 receiving the fourth latched signal LSIG1_3 is valid.

The input signal remains "H", and the delayed input signal SIG is "H" at time T44. Then, those latch circuits 454 that latch the delayed input signal SIG at the falling edges of the double-cycle delayed clocks DCLK0 to DCLK4 latch the delayed input signal SIG at "H", whereby the second latched signals SIG1_0 to SIG1_2 remain "H" and the second latched signals SIG1_3 to SIG1_4 go "H" at respective points in time as shown in the figures.

After the latch circuit 454 that latches the delayed input signal SIG at the falling edge of the double-cycle delayed clock DCLK4 latches the delayed input signal SIG after time T44, the second latched signals SIG1_0 to SIG1_4 are all of the same logical value, whereby the signals TRM1_1 to TRM1_4 are "H".

Around Time T45

At the rising edge of the double-cycle delayed clock DCLK0, the outputs of the logic elements 461 receiving the third latched signals LSIG0_0 to LSIG0_4 are latched by the latch circuits 459, whereby the fifth latched signals DATA0_0 to DATA0_2 and DATA0_4 are "L" and the fifth latched signal DATA0_3 is "H". At this point, as the double-cycle delayed clock DCLK0 goes "H", the fifth latched signals DATA0_0 to DATA0_4 are output from the corresponding selector 463. Then, the finalized output signal DATA goes "H" when the double-cycle delayed clock DCLK0 goes "H".

At the rising edges of the double-cycle delayed clocks DCLK0 to DCLK4, the first latched signals SIG0_0 to SIG0_4 are latched by the latch circuits 455, whereby the third latched signals LSIG0_0 to LSIG0_2 are "L" and the third latched signals LSIG0_3 to LSIG0_4 are "H".

At the rising edge of the double-cycle delayed clock DCLK0, the outputs TRM0_1 to TRM0_4 of the EX-NOR circuits 152 are latched by the latch circuits 457, whereby the first determination signals GATE0_1 to GATE0_2 and GATE0_4 are "H" and the first determination signal GATE0_3 is "L". Since the first determination signals GATE0_1 to GATE0_4 are not all of the same logical value, the first logical value determination signal GATE0FIX is "H". Since the first determination signals GATE0_1 to GATE0_2 and GATE0_4 are "H", the first determination signal GATE0_3 is "L" and the first logical value determination signal GATE0FIX is "H", the outputs of the logic elements 461 receiving the third latched signals LSIG0_0 to LSIG0_2 and LSIG0_4 are "L", and the output of the logic element 461 receiving the third latched signal LSIG0_3 is valid.

The input signal goes "L", and the delayed input signal SIG goes "L" at time T45. Since the double-cycle delayed clocks DCLK3 and DCLK4 rise after time T45, those latch circuits 453 that latch the delayed input signal SIG at the rising edges of the double-cycle delayed clocks DCLK3 and DCLK4 latch the delayed input signal SIG at "L", whereby the first latched signals SIG0_3 and SIG0_4 are "L". Since the double-cycle delayed clocks DCLK0 to DCLK2 rise before time T45, those latch circuits 453 that latch the delayed input signal SIG at the rising edges of the double-cycle delayed clocks DCLK0 to DCLK2 latch the delayed input signal SIG at "H", whereby the first latched signals SIG0_0 to SIG0_2 are "H".

After the latch circuit 453 that latches the delayed input signal SIG at the rising edge of the double-cycle delayed clock DCLK4 latches the delayed input signal SIG after time T45, the first latched signals SIG0_0 to SIG0_2 are of the same logical value, the first latched signals SIG0_3 and SIG0_4 are of the same logical value, and the first latched signals SIG0_2 and SIG0_3 are of different logical values, whereby the signals TRM0_1 to TRM0_2 and TRM0_4 are "H" and the signal TRM0_3 is "L".

Around Time T46

At the falling edge of the double-cycle delayed clock DCLK0, the outputs of the logic elements 461 receiving the fourth latched signals LSIG1_0 to LSIG1_4 are latched by the latch circuits 460, whereby the sixth latched signals DATA1_0 to DATA1_4 are "L". At this point, as the double-cycle delayed clock DCLK0 goes "L", the sixth latched signals DATA1_0 to DATA1_4 are output from the selectors 463, and the finalized output signal DATA goes "L".

At the falling edges of the double-cycle delayed clocks DCLK0 to DCLK4, the second latched signals SIG1_0 to SIG1_4 are latched by the latch circuits 456, whereby the fourth latched signals LSIG1_0 to LSIG1_4 are "H".

At the falling edge of the double-cycle delayed clock DCLK0, the outputs TRM1_1 to TRM1_4 of the EX-NOR circuits 152 are latched by the latch circuits 458, whereby the second determination signals GATE1_1 to GATE1_4 are "H". Since the second determination signals GATE1_1 to GATE1_4 are all of the same logical value, the second logical value determination signal GATE1FIX is "L". Since the second determination signals GATE1_1 to GATE1_4 are "H" and the second logical value determination signal GATE1FIX is "L", the outputs of the logic elements 461 receiving the fourth latched signals LSIG1_1 to LSIG1_4 are "L", and the output of the logic element 461 receiving the fourth latched signal LSIG1_0 is valid.

The input signal goes "H", and the delayed input signal SIG goes "H" at time T46. Since the double-cycle delayed clocks DCLK2 to DCLK4 fall after time T46, those latch circuits 454 that latch the delayed input signal SIG at the falling edges of the double-cycle delayed clocks DCLK2 to DCLK4 latch the delayed input signal SIG at "H", and the second latched signals SIG1_2 to SIG1_4 go "H" at respective points in time as shown in the figure. Since the double-cycle delayed clocks DCLK0 to DCLK1 fall before time T46, those latch circuits 454 that latch the delayed input signal SIG at the falling edges of the double-cycle delayed clocks DCLK0 to DCLK1 latch the delayed input signal SIG at "L", whereby the second latched signals SIG1_0 to SIG1_1 go "L".

After the latch circuit 454 that latches the delayed input signal SIG at the falling edge of the double-cycle delayed clock DCLK4 latches the delayed input signal SIG after time T46, the second latched signals SIG1_0 to SIG1_1 are of the same logical value, the second latched signals SIG1_2 to SIG1_4 are of the same logical value, and the second latched signals SIG1_1 and SIG1_2 are of different logical values, whereby the signals TRM1_1 and TRM1_3 to TRM1_4 are "H" and the signal TRM1_2 is "L".

Around Time T47

At the rising edge of the double-cycle delayed clock DCLK0, the outputs of the logic elements 461 receiving the third latched signals LSIG0_0 to LSIG0_4 are latched by the latch circuits 459, whereby the fifth latched signals DATA0_0 to DATA0_2 and DATA0_4 are "L" and the fifth latched signal DATA0_3 is "H". At this point, as the double-cycle delayed clock DCLK0 goes "H", the fifth latched signals DATA0_0 to DATA0_4 are output from the selectors 463, and the finalized output signal DATA goes "H".

At the rising edges of the double-cycle delayed clocks DCLK0 to DCLK4, the first latched signals SIG0_0 to SIG0_4 are latched by the latch circuits 455, whereby the third latched signals LSIG0_0 to LSIG0_2 are "H" and the third latched signals LSIG0_3 to LSIG0_4 are "L".

At the rising edge of the double-cycle delayed clock DCLK0, the outputs TRM0_1 to TRM0_4 of the EX-NOR circuits 152 are latched by the latch circuits 457, whereby the first determination signals GATE0_1 to GATE0_2 and GATE0_4 are "H" and the first determination signal GATE0_3 is "L". Since the first determination signals GATE0_1 to GATE0_4 are not all of the same logical value, the first logical value determination signal GATE0FIX is "H". Since the first determination signals GATE0_1 to GATE0_2 and GATE0_4 are "H", the first determination signal GATE0_3 is "L" and the first logical value determination signal GATE0FIX is "H", the outputs of the logic elements 461 receiving the third latched signals LSIG0_0 to LSIG0_2 and LSIG0_4 are "L", and the output of the logic element 461 receiving the third latched signal LSIG0_3 is valid.

The input signal goes "L", and the delayed input signal SIG goes "L" at time T47. Since the double-cycle delayed clocks DCLK2 to DCLK4 rise after time T47, the latch circuits 453 that latch the delayed input signal SIG at the rising edges of the double-cycle delayed clocks DCLK2 to DCLK4 latch the delayed input signal SIG at "L", whereby the first latched signals SIG0_2 to SIG0_4 are "L". Since the double-cycle delayed clocks DCLK0 to DCLK1 rise before time T47, the latch circuits 453 that latch the delayed input signal SIG at the rising edges of the double-cycle delayed clocks DCLK0 to DCLK1 latch the delayed input signal SIG at "H", whereby the first latched signals SIG0_0 to SIG0_1 are "H".

After the latch circuit 453 that latches the delayed input signal SIG at the rising edge of the double-cycle delayed clock DCLK4 latches the delayed input signal SIG after time T47, the first latched signals SIG0_0 to SIG0_1 of the same logical value, the first latched signals SIG0_2 to SIG0_4 are of the same logical value, and the first latched signals SIG0_1 and SIG0_2 are of different logical values, whereby the signals TRM0_1 and TRM0_3 to TRM0_4 is "H" and the signal TRM0_2 is "L".

Around Time T48

At the falling edge of the double-cycle delayed clock DCLK0, the outputs of the logic elements 461 receiving the fourth latched signals LSIG1_0 to LSIG1_4 are latched by the latch circuits 460, whereby the sixth latched signal DATA1_0 is "H" and the sixth latched signals DATA1_1 to DATA1_4 are "L". At this point, as the double-cycle delayed clock DCLK0 goes "L", the sixth latched signals DATA1_0 to DATA1_4 are output from the selectors 463, and the finalized output signal DATA is "H".

At the falling edges of the double-cycle delayed clocks DCLK0 to DCLK4, the second latched signals SIG1_0 to SIG1_4 are latched by the latch circuits 456, whereby the fourth latched signals LSIG1_0 to LSIG1_1 are "L" and the fourth latched signals LSIG1_2 to LSIG1_4 are "H".

At the falling edge of the double-cycle delayed clock DCLK0, the outputs TRM1_1 to TRM1_4 of the EX-NOR circuits 152 are latched by the latch circuits 458, whereby the second determination signals GATE1_1 and GATE1_3 to GATE1_4 are "H" and the second determination signal GATE1_2 is "L". Since the second determination signals GATE1_1 to GATE1_4 are not all of the same logical value, the second logical value determination signal GATE1FIX is "H". Since the second determination signals GATE1_1 and GATE1_3 to GATE1_4 are "H", the second determination signal GATE1_2 is "L" and the second logical value determination signal GATE1FIX is "H", the outputs of the logic elements 461 receiving the fourth latched signal signals LSIG1_0 to LSIG1_1 and LSIG1_3 to LSIG1_4 are "L", and the output of the logic element 461 receiving the fourth latched signal LSIG1_2 is valid.

The input signal goes "H", and the delayed input signal SIG goes "H" at time T48. Since the double-cycle delayed clock DCLK4 falls after time T48, the latch circuit 454 that latches the delayed input signal SIG at the falling edge of the double-cycle delayed clock DCLK4 latches the delayed input signal SIG at "H", and the second latched signal SIG1_4 goes "H" at a point in time as shown in the figure. Since the double-cycle delayed clocks DCLK0 to DCLK3 fall before time T48, those latch circuits 454 that latch the delayed input signal SIG at the falling edges of the double-cycle delayed clocks DCLK0 to DCLK3 latch the delayed input signal SIG at "L", whereby the second latched signals SIG1_0 to SIG1_3 are "L".

After the latch circuit 454 that latches the delayed input signal SIG at the falling edge of the double-cycle delayed clock DCLK4 latches the delayed input signal SIG after time T48, the second latched signals SIG1_0 to SIG1_3 are of the same logical value, and the second latched signals SIG1_3 and SIG1_4 are of different logical values, whereby the signals TRM1_1 to TRM1_3 are "H" and the signal TRM1_4 is "L".

Around Time T49

At the rising edge of the double-cycle delayed clock DCLK0, the outputs of the logic elements 461 receiving the third latched signals LSIG0_0 to LSIG0_4 are latched by the latch circuits 459, whereby the fifth latched signals DATA0_0 to DATA0_4 are "L". At this point, as the double-cycle delayed clock DCLK0 goes "H", the fifth latched signals DATA0_0 to DATA0_4 are output from the selectors 463, and the finalized output signal DATA goes "L".

At the rising edges of the double-cycle delayed clocks DCLK0 to DCLK4, the first latched signals SIG0_0 to SIG0_4 are latched by the latch circuits 455, whereby the third latched signals LSIG0_0 to LSIG0_1 are "H" and the third latched signals LSIG0_2 to LSIG0_4 are "L".

At the rising edge of the double-cycle delayed clock DCLK0, the outputs TRM0_1 to TRM0_4 of the EX-NOR circuits 152 are latched by the latch circuits 457, whereby the first determination signal GATE0_1 and GATE0_3 to GATE0_4 are "H" and the first determination signal GATE0_2 is "L". Since the first determination signals GATE0_1 to GATE0_4 are not all of the same logical value, the first logical value determination signal GATE0FIX is "H". Since the first determination signals GATE0_1 and GATE0_3 to GATE0_4 are "H", the first determination signal GATE0_2 is "L" and the first logical value determination signal GATE0FIX is "H", the outputs of the logic elements 461 receiving the third latched signals LSIG0_0 to LSIG0_1 and LSIG0_3 to LSIG0_4 are "L" and the output of the logic element 461 receiving the third latched signal LSIG0_2 is valid.

The input signal goes "L", and the delayed input signal SIG goes "L" at time T49. Since the double-cycle delayed clock DCLK4 rise after time T49, the latch circuit 453 that latches the delayed input signal SIG at the rising edge of the double-cycle delayed clock DCLK4 latches the delayed input signal SIG at "L", whereby the first latched signal SIG0_4 is "L". Since the double-cycle delayed clocks DCLK0 to DCLK3 rise before time T49, those latch circuits 453 that latch the delayed input signal SIG at the rising edges of the double-cycle delayed clocks DCLK0 to DCLK3 latch the delayed input signal SIG at "H", whereby the first latched signals SIG0_0 to SIG0_3 are "H".

After the latch circuit 453 that latches the delayed input signal SIG at the rising edge of the double-cycle delayed clock DCLK4 latches the delayed input signal SIG after time T49, the first latched signals SIG0_0 to SIG0_3 are of the same logical value and the first latched signals SIG0_3 and SIG0_4 are of different logical values, whereby the signals TRM0_1 to TRM0_3 are "H" and the signal TRM0_4 is "L".

Around Time T410

At the falling edge of the double-cycle delayed clock DCLK0, the outputs of the logic elements 461 receiving the fourth latched signals LSIG1_0 to LSIG1_4 are latched by the latch circuits 460, whereby the sixth latched signals DATA1_0 to DATA1_1 and DATA1_3 to DATA1_4 are "L" and the sixth latched signal DATA1_2 is "H". At this point, as the double-cycle delayed clock DCLK0 goes "L", the sixth latched signals DATA1_0 to DATA1_4 are output from the selectors 463, and the finalized output signal DATA goes "H".

At the falling edges of the double-cycle delayed clocks DCLK0 to DCLK4, the second latched signals SIG1_0 to SIG1_4 are latched by the latch circuits 456, whereby the fourth latched signals LSIG1_0 to LSIG1_3 are "L" and the fourth latched signal LSIG1_4 is "H".

At the falling edge of the double-cycle delayed clock DCLK0, the outputs TRM1_1 to TRM1_4 of the EX-NOR circuits 152 are latched by the latch circuits 458, whereby the second determination signals GATE1_1 to GATE1_3 are "H" and the second determination signal GATE1_4 is "L". Since the second determination signals GATE1_1 to GATE1_4 are not all of the same logical value, the second logical value determination signal GATE1FIX is "H". Since the second determination signals GATE1_1 to GATE1_3 are "H", the second determination signal GATE1_4 is "L" and the second logical value determination signal GATE1FIX is "H", the outputs of the logic elements 461 receiving the fourth latched signals LSIG1_0 to LSIG1_3 are "L" and the output of the logic element 461 receiving the fourth latched signal LSIG1_4 is valid.

The input signal remains "L", and the delayed input signal SIG is "L" near time T410. Then, those latch circuits 454 that latch the delayed input signal SIG at the falling edges of the double-cycle delayed clocks DCLK0 to DCLK4 latch the delayed input signal SIG at "L", whereby the second latched signals SIG1_0 to SIG1_4 go "L" at respective points in time as shown in the figure.

After the latch circuit 454 that latches the delayed input signal SIG at the falling edge of the double-cycle delayed clock DCLK4 latches the delayed input signal SIG after time T410, the second latched signals SIG1_0 to SIG1_4 are of the same logical value, whereby the signals TRML1_1 to TRM1_4 are "H".

Around Time T411

At the rising edge of the double-cycle delayed clock DCLK0, the outputs of the logic elements 461 receiving the third latched signals LSIG0_0 to LSIG0_4 are latched by the latch circuits 459, whereby the fifth latched signals DATA0_0 to DATA0_4 are "L". At this point, as the double-cycle delayed clock DCLK0 goes "H", the fifth latched signals DATA0_0 to DATA0_4 are output from the selectors 463, and the finalized output signal DATA goes "L".

At the rising edges of the double-cycle delayed clocks DCLK0 to DCLK4, the first latched signals SIG0_0 to SIG0_4 are latched by the latch circuits 455, whereby the third latched signals LSIG0_0 to LSIG0_3 are "H" and the third latched signal LSIG0_4 is "L".

At the rising edge of the double-cycle delayed clock DCLK0, the outputs TRM0_1 to TRM0_4 of the EX-NOR circuits 152 are latched by the latch circuits 457, whereby the first determination signals GATE0_1 to GATE0_3 are "H" and the first determination signal GATE0_4 is "L". Since the first determination signals GATE0_1 to GATE0_4 are not all of the same logical value, the first logical value determination signal GATE0FIX is "H". Since the first determination signals GATE0_1 to GATE0_3 is "H", the first determination signal GATE0_4 is "L" and the first logical value determination signal GATE0FIX is "H", the outputs of the logic elements 461 receiving the third latched signals LSIG0_0 to LSIG0_3 are "L" and the output of the logic element 461 receiving the third latched signal LSIG0_4 is valid.

The input signal remains "L", and the delayed input signal SIG is "L" near time T411. Then, those latch circuits 453 that latch the delayed input signal SIG at the rising edges of the double-cycle delayed clocks DCLK0 to DCLK4 latch the delayed input signal SIG at "L", whereby the first latched signals SIG0_0 to SIG0_4 are "L".

After the latch circuit 453 that latches the delayed input signal SIG at the rising edge of the double-cycle delayed clock DCLK4 latches the delayed input signal SIG after time T411, the first latched signals SIG0_0 to SIG0_4 are of the same logical value, whereby the outputs TRM0_1 to TRM0_4 are "H".

Around Time T412

At the falling edge of the double-cycle delayed clock DCLK0, the outputs of the logic elements 461 receiving the fourth latched signals LSIG1_0 to LSIG1_4 are latched by the latch circuits 460, whereby the sixth latched signals DATA1_0 to DATA1_3 are "L" and the sixth latched signal DATA1_4 is "H". At this point, as the double-cycle delayed clock DCLK0 goes "L", the sixth latched signals DATA1_0 to DATA1_4 are output from the selectors 463, and the finalized output signal DATA goes "H".

At the falling edges of the double-cycle delayed clocks DCLK0 to DCLK4, the second latched signals SIG1_0 to SIG1_4 are latched by the latch circuits 456, whereby the fourth latched signals LSIG1_0 to LSIG1_4 are "L".

At the falling edge of the double-cycle delayed clock DCLK0, the outputs TRM1_1 to TRM1_4 of the EX-NOR circuits 152 are latched by the latch circuits 458, whereby the second determination signals GATE1_1 to GATE1_4 are "H". Since the second determination signals GATE1_1 to GATE1_4 are all of the same logical value, the second logical value determination signal GATE1FIX is "L". Since the second determination signals GATE1_1 to GATE1_4 is "H" and the second logical value determination signal GATE1FIX is "L", the outputs of the logic elements 461 receiving the fourth latched signals LSIG1_1 to LSIG1_4 are "L" and the output of the logic element 461 receiving the fourth latched signal LSIG1_0 is valid.

The input signal remains "L", and the delayed input signal SIG is "L" near time T412. Then, those latch circuits 454 that latch the delayed input signal SIG at the falling edges of the double-cycle delayed clocks DCLK0 to DCLK4 latch the delayed input signal SIG at "L", whereby the second latched signals SIG1_0 to SIG1_4 are "L".

After the latch circuit 454 that latches the delayed input signal SIG at the falling edge of the double-cycle delayed clock DCLK4 latches the delayed input signal SIG after time T412, second latched signals SIG1_0 to SIG1_4 are of the same logical value, whereby the signals TRM1_1 to TRM1_4 are "H".

Around Time T413

At the rising edge of the double-cycle delayed clock DCLK0, the outputs of the logic elements 461 receiving the third latched signals LSIG0_0 to LSIG0_4 are latched by the latch circuits 459, whereby the fifth latched signals DATA0_0 to DATA0_4 is "L". At this point, as the double-cycle delayed clock DCLK0 goes "H", the fifth latched signals DATA0_0 to DATA0_4 are output from the selectors 463, and the finalized output signal DATA goes "L".

At the rising edges of the double-cycle delayed clocks DCLK0 to DCLK4, the first latched signals SIG0_0 to SIG0_4 are latched by the latch circuits 455, whereby the third latched signals LSIG0_0 to LSIG0_4 are "L".

At the rising edge of the double-cycle delayed clock DCLK0, the outputs TRM0_1 to TRM0_4 of the EX-NOR circuits 152 are latched by the latch circuits 457, whereby the first determination signals GATE0_1 to GATE0_4 are "H". Since the first determination signals GATE0_1 to GATE0_4 are all of the same logical value, the first logical value determination signal GATE0FIX is "L". Sine the first determination signals GATE0_1 to GATE0_4 are "H" and the first logical value determination signal GATE0FIX is "L", the outputs of the logic elements 461 receiving the third latched signals LSIG0_1 to LSIG0_4 are "L" and the output of the logic element 461 receiving the third latched signal LSIG0_0 is valid.

The input signal remains "L", and the delayed input signal SIG is "L" near time T413. Then, those latch circuits 453 that latch the delayed input signal SIG at the rising edges of the double-cycle delayed clocks DCLK0 to DCLK4 latch the delayed input signal SIG at "L", whereby the first latched signals SIG0_0 to SIG0_4 are "L".

After the latch circuit 453 that latches the delayed input signal SIG at the rising edge of the double-cycle delayed clock DCLK4 latch the delayed input signal SIG after time T413, the first latched signals SIG0_0 to SIG0_4 are of the same logical value, whereby the outputs TRM0_1 to TRM0_4 are "H".

Around Time T414

At the falling edge of the double-cycle delayed clock DCLK0, the outputs of the logic elements 461 receiving the fourth latched signals LSIG1_0 to LSIG1_4 are latched by the latch circuits 460, whereby the sixth latched signals DATA1_0 to DATA1_4 are "L". At this point, as the double-cycle delayed clock DCLK0 goes "L", the sixth latched signals DATA1_0 to DATA1_4 are output from the selectors 463, and the finalized output signal DATA is "L".

At the falling edges of the double-cycle delayed clocks DCLK0 to DCLK4, the second latched signals SIG1_0 to SIG1_4 are latched by the latch circuits 456, whereby the fourth latched signals LSIG1_0 to LSIG1_4 are "L".

At the falling edge of the double-cycle delayed clock DCLK0, the outputs TRM1_1 to TRM1_4 of the EX-NOR circuits 152 are latched by the latch circuits 458, whereby the second determination signals GATE1_1 to GATE1_4 are "H". Since the second determination signals GATE1_1 to GATE1_4 are all of the same logical value, the second logical value determination signal GATE1FIX is "L". Since the second determination signals GATE1_1 to GATE1_4 are "H" and the second logical value determination signal GATE1FIX is "L", the outputs of the logic elements 461 receiving the fourth latched signals LSIG1_1 to LSIG1_4 are "L" and the output of the logic element 461 receiving the fourth latched signal LSIG1_0 is valid.

The input signal remains "L", and the delayed input signal SIG is "L" near time T414. Then, those latch circuits 454 that latch the delayed input signal SIG at the falling edges of the double-cycle delayed clocks DCLK0 to DCLK4 latch the delayed input signal SIG at "L", whereby the second latched signals SIG1_0 to SIG1_4 are "L".

After the latch circuit 454 that latches the delayed input signal SIG at the falling edge of the double-cycle delayed clock DCLK4 latch the delayed input signal SIG after time T414, the second latched signals SIG1_0 to SIG1_4 are of the same logical value, whereby the outputs TRM1_1 to TRM1_4 of the EX-NOR circuits 152 are "H".

As described above, even if the semiconductor memory device is operating at a high clock frequency, it is possible to constantly detect the transitions of the input signal to determine the outputs TRM0_1 to TRM0_4 and TRM1_1 to TRM1_4 of the EX-NOR circuits 152, the first logical value determination signal GATE0FIX, and the second logical value determination signal GATE1FIX.

One of the third latched signals LSIG0_0 to LSIG0_4 becomes valid based on the outputs TRM0_1 to TRM0_4 of the EX-NOR circuits 152 and the first logical value determination signal GATE0FIX, and one of the fourth latched signals LSIG1_0 to LSIG1_4 becomes valid based on the outputs TRM1_1 to TRM1_4 of the EX-NOR circuits 152 and the second logical value determination signal GATE1FIX, thereby determining the fifth latched signals DATA0_0 to DATA0_4 and the sixth latched signals DATA1_0 to DATA1_4.

As the double-cycle delayed clocks DCLK0 to DCLK4 are used to select either the fifth latched signals DATA0_0 to DATA0_4 or the sixth latched signals DATA1_0 to DATA1_4, the finalized input signal DATA transitions in synchronism with the valid one of the fifth latched signals DATA0_0 to DATA0_4 and the sixth latched signals DATA1_0 to DATA1_4.

In other words, the input signal can be latched on one of the double-cycle delayed clocks DCLK0 to DCLK4, no matter when the input signal is input.

The precision of the timing of latching the input signal can be improved by increasing the number of double-cycle delayed clocks to be generated.

With such a circuit configuration and such timing adjustment means, even if one clock cycle is close to the sum of the setup time and the hold time of the input signal and even when the semiconductor memory device is in operation, it is possible to constantly detect the transitions of the input signal to automatically determine the timing at which to latch the input signal such that the input signal is prevented from being determined erroneously due to the phase difference between the input signal and the clock, without requiring a complicated clock test sequence for the phase adjustment between the input signal and the clock or a sequencer circuit for realizing the clock test and without performing a clock test operation of transitioning the input signal in synchronism with the clock.

Embodiment 5

Figure 13:
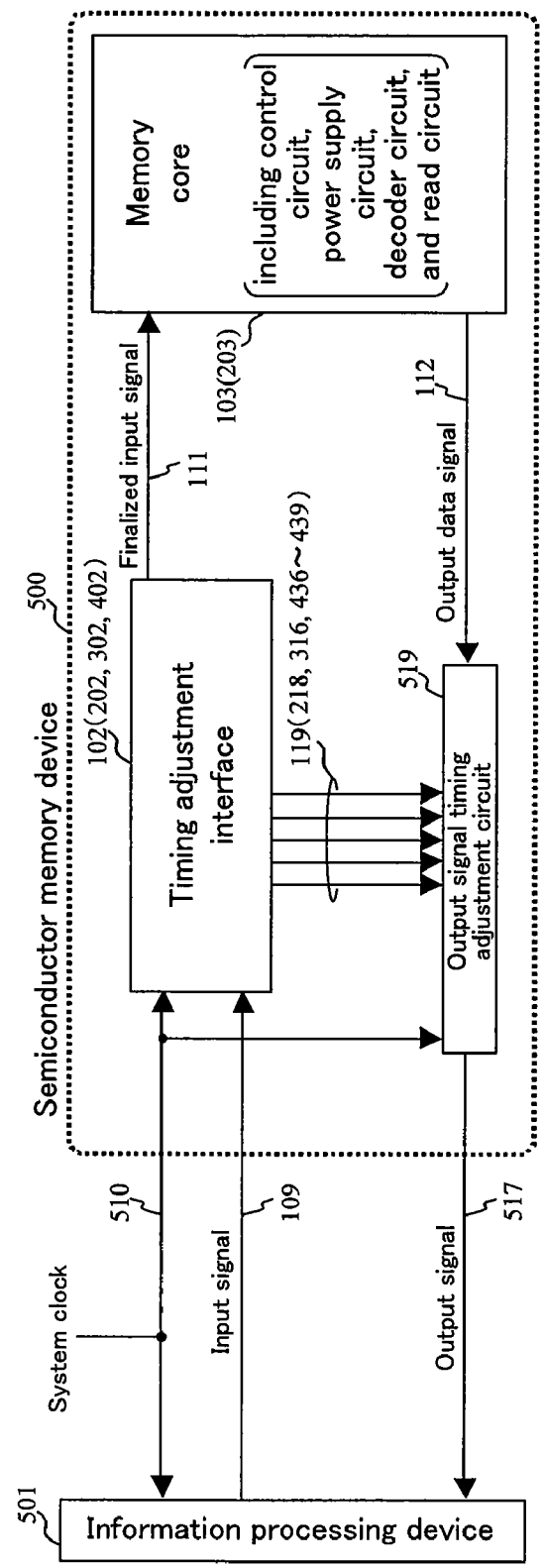
FIG. 13 is schematic block diagram showing a configuration of a part of a semiconductor memory device 500 according to Embodiment 5 of the present invention.

FIG. 13 is a schematic block diagram showing a configuration of a part of a semiconductor memory device 500 according to Embodiment 5 of the present invention.

The semiconductor memory device 500 and an information processing device 501 for controlling the semiconductor memory device 500 are connected to each other by the input signal 109 and an output signal 517. A common system clock 510 is input to the semiconductor memory device 500 (more specifically, the timing adjustment interface 102 and an output signal timing adjustment circuit 519 in the semiconductor memory device 500 as will be described below) and to the information processing device 501.

The semiconductor memory device 500 includes the timing adjustment interface 102 and the memory core 103 (FIG. 1) as described above in Embodiment 1, for example, and further includes the output signal timing adjustment circuit 519. The timing adjustment interface 102 and the memory core 103 are connected to each other by the finalized input signal 111, and the output signal timing adjustment circuit 519 and the memory core 103 are connected to each other by the output data signal 112. Note that FIG. 13 does not show signals such as the register change control signal 120 between the timing adjustment interface 102 and the memory core 103.

The timing adjustment interface 102 outputs the register signal 119 (the phase difference determination signal) to the output signal timing adjustment circuit 519.

The output signal timing adjustment circuit 519 detects the input timing difference between the system clock 510 and the input signal 109 based on the system clock 510 and the register signal 119 (the phase difference determination signal), and outputs the output signal 517 at a timing of which the phase difference has been adjusted.

An operation of the semiconductor memory device 500 having such a configuration will be described.

Figure 14:
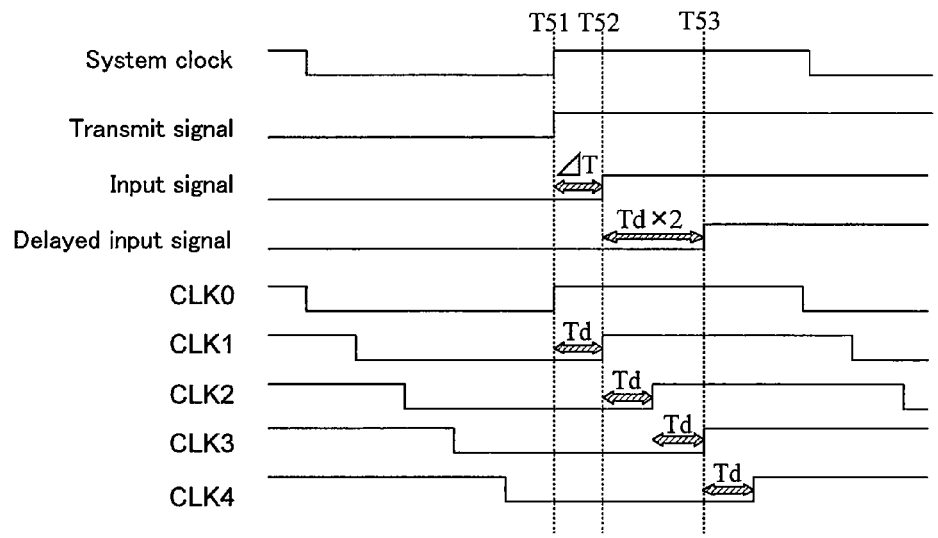
FIG. 14 is a timing diagram showing signals of various parts according to Embodiment 5 of the present invention.

FIG. 14 shows a timing diagram of the system clock 510, the transmit signal transmitted from the information processing device 501 in synchronism with the system clock 510, the input signal 109 input to the semiconductor memory device 500, the delayed input signal 113 obtained by delaying the input signal 109 at the timing adjustment interface 102, and the five delayed clocks 114 (CLK0 to CLK4), for example, generated from the input system clock 510.

A time ΔT in FIG. 14 denotes a signal propagation time, i.e., an amount of time required from the transmission of the transmit signal from the information processing device 501 until the transmit signal reaches the semiconductor memory device 500. A time Td is a delay time, i.e., an amount of delay, to be given to the input signal 109 and the system clock 510 by the delay section 150 in the timing adjustment interface 102. The delayed clocks CLK0 to CLK4 are shifted in time from one another by the delay time Td. In the illustrated example, the delayed input signal 113 is generated by delaying the input signal by the time Td×2.

The transmit signal goes "H" at time T51 in the information processing device 501 in synchronism with the system clock. Then, the input signal 109 to the semiconductor memory device 500 goes "H" at time T52, i.e., after the signal propagation time ΔT since time T51.

The delayed input signal 113 goes "H" at time T53, i.e., after the time Td×2 since time T52 at which the input signal goes "H". The delayed input signal 113 going "H" at time T53 can be readily known from the register signal 119 output from the timing adjustment interface 102 (the phase difference determination signal) as already described above.

Time T51 is the rising edge of the system clock 510, and the amount of time (T53−T51) can be known by measuring the amount of time from the rising edge of the system clock 510 until the delayed input signal 113 goes "H". Since the amount of time (T53−T51) is (signal propagation time ΔT+delay time Td×2), the signal propagation time ΔT is what is obtained by subtracting the delay time Td×2 from the amount of time (T53−T51).

The output signal timing adjustment circuit 519 outputs the output signal 517 with a delay time of (cycle of system clock 510−signal propagation time ΔT) from the system clock 510.

Figure 15:
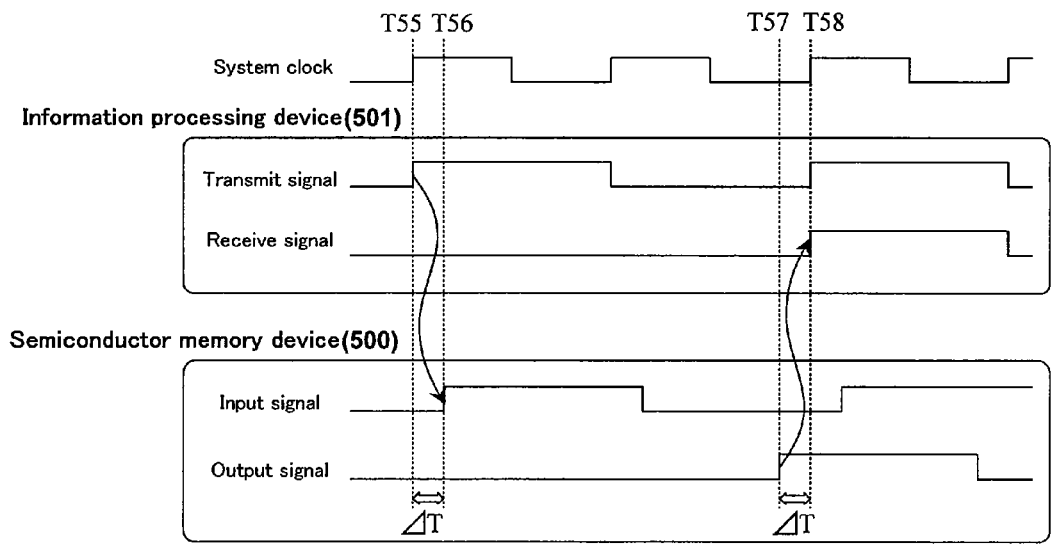
FIG. 15 is a timing diagram showing an output signal timing adjustment operation according to Embodiment 5 of the present invention.

FIG. 15 shows a timing diagram of signals in a case where the output signal timing adjustment is performed according to Embodiment 5.

The information processing device 501 and the semiconductor memory device 500 operate on the common system clock 510. A transmit signal is transmitted from the information processing device 501, and input to the semiconductor memory device 500 as the input signal 109. Then, the output signal 517 is output from the semiconductor memory device 500, and is received by the information processing device 501 as the receive signal.

As the information processing device 501 transitions the transmit signal to "H" at time T55 (the rising edge of the system clock 510), the signal is transmitted to the semiconductor memory device 500 with a delay of the signal propagation time ΔT, and the semiconductor memory device 500 receives the input signal 109, which goes "H" at time T56. The signal propagation time ΔT can be detected by the timing adjustment interface 102 provided in the semiconductor memory device as described above.

Then, as the semiconductor memory device 500 outputs the output signal 517, which transitions to "H" at time T57, which is earlier than time T58 (the rising edge of the system clock) by the signal propagation time ΔT, the information processing device 501 can receive the receive signal that goes "H" at time T58.

Figure 16:
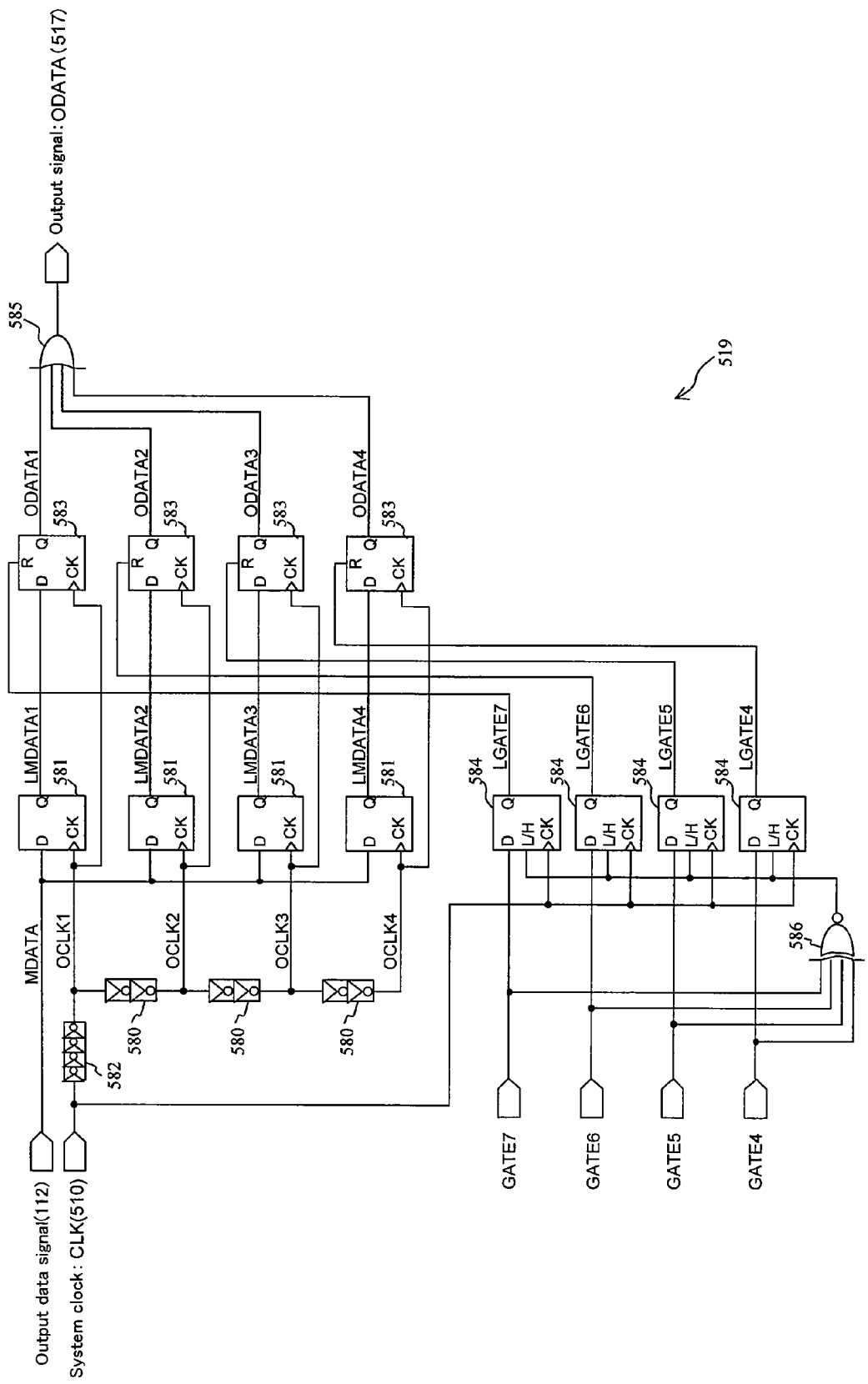
FIG. 16 is a circuit diagram showing a configuration of an output signal timing adjustment circuit according to Embodiment 5 of the present invention.

FIG. 16 is a circuit diagram showing a specific configuration of the output signal timing adjustment circuit 519. The output signal timing adjustment circuit 519 includes delay circuits 580 and 582, four first latch circuits 581, four second latch circuits 584, four third latch circuits 583, an OR circuit 585 for integrating together the latched signals from the third latch circuits 583, and an EX-NOR circuit 586.

The delay circuit 582 outputs a delayed clock OCLK1 obtained by delaying the system clock CLK by nearly one cycle. The delay circuits 580 output delayed clocks OCLK2 to OCLK4 of different delay times. It is preferred that the delay time of the delay circuit 580 is shorter than that of the delay circuit 582.

The EX-NOR circuit 586 receives input register signals GATE4 to GATE7, and outputs "H" if the register signals GATE4 to GATE7 are all of the same logical value and outputs "L" otherwise. In Embodiments 1 to 4, the number of delayed clocks is set to n=5, for the sake of simplicity, wherein the register signals are GATE0 to GATE4 or GATE-FIX and GATE1 to GATE4. However, the number of delayed clocks may be n≧5, e.g., n=7. The signals GATE4 to GATE7 are shown herein as an example of Embodiments 1 to 4, where n=7.

The first latch circuits 581 latches an output data signal MDATA on the delayed clocks OCLK1 to OCLK4 to output first latched signals LMDATA1 to LMDATA4, respectively.

The second latch circuits 584 latch the received register signals GATE4 to GATE7 on the system clock CLK to output second latched signals LGATE4 to LGATE7, respectively. The second latch circuits 584 are controlled by the output of the EX-NOR circuit 586, and if the register signals GATE4 to GATE7 are all of the same logical value, the signals GATE4 to GATE7 are not latched by the second latch circuits 584, thereby holding the outputs of the second latch circuits 584.

The third latch circuits 583 latch the first latched signals LMDATA1 to LMDATA4 on the delayed clocks OCLK1 to OCLK4 to output third latched signals LDATA1 to ODATA4, respectively. The third latch circuits 583 are controlled by the second latched signals LGATE4 to LGATE7, wherein the latch circuits controlled by those of the second latched signals LGATE4 to LGATE7 being "H" are reset, and only the output of the latch circuit controlled by one of the second latched signals LGATE4 to LGATE7 being "L" is valid.

The OR circuit 585 receives third latched signals ODATA1 to ODATA4 to output an output signal ODATA.

Although the first to third groups of latching circuits each include four latch circuits herein, the number of latch circuits is not limited to four, and the precision of the output timing adjustment can be improved by increasing the number of latch circuits.

Figure 17:
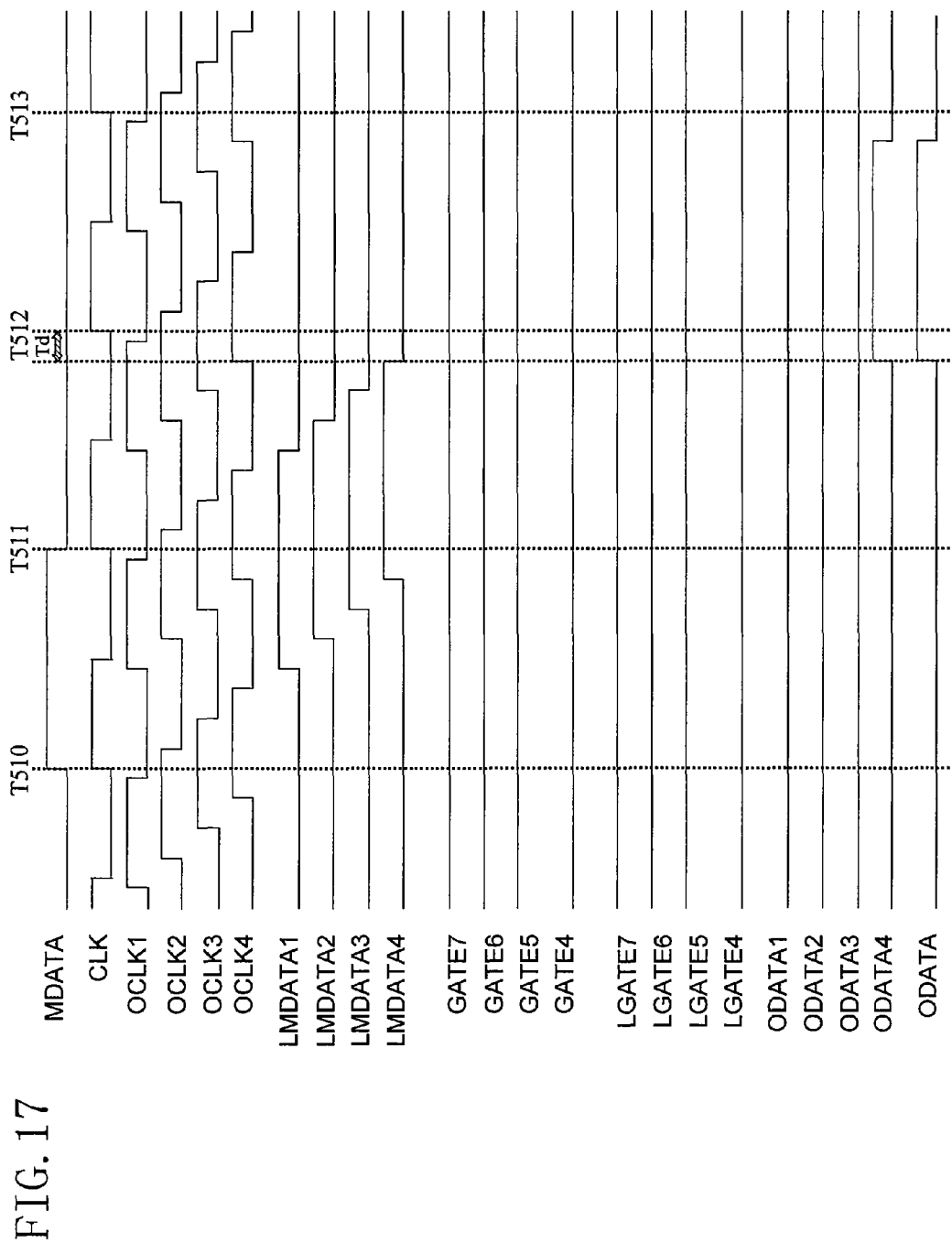
FIG. 17 is a timing diagram showing an output signal timing adjustment operation of the output signal timing adjustment circuit according to Embodiment 5 of the present invention.
Figure 18:
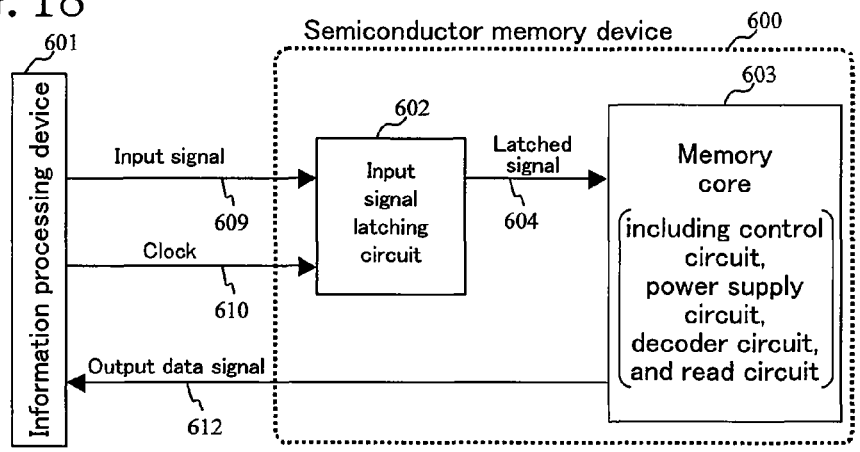
FIG. 18 is a schematic block diagram showing a configuration of a part of a conventional semiconductor memory device.
Figure 19A:
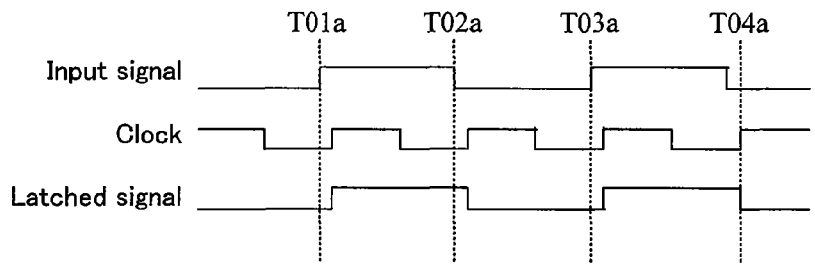
FIGS. 19A to 19C are timing diagrams each showing an operation of the conventional semiconductor memory device.
Figure 19B:
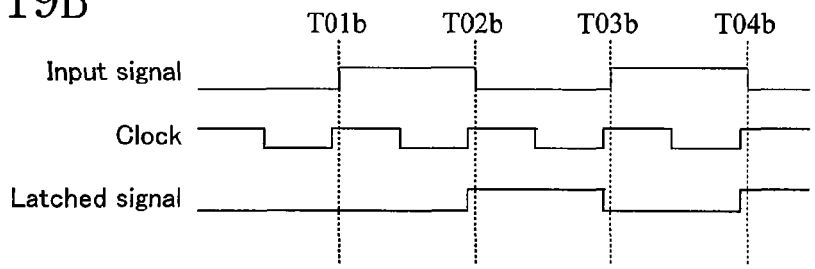
Figure 19C:
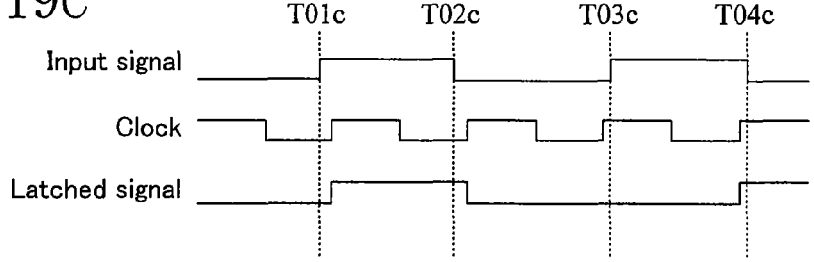

FIG. 17 shows waveforms during a timing adjustment operation to be performed with a circuit configuration shown in FIG. 16. The delayed clocks OCLK1 to OCLK4 are delayed by the delay circuits 582 and 580 as shown in the figure, wherein the system clock CLK rises after the passage of the time Td from the rising edge of the delayed clock OCLK4.

As the system clock CLK goes "H" at time T510, the register signals GATE4 to GATE7 are latched by the second latch circuits 584, whereby the second latched signals LGATE5 to LGATE7 are "H" and the second latched signal LGATE4 is "L".

As the output data signal MDATA goes "H" at time T510, the output data signal MDATA is latched by the first latch circuits 581 at the rising edges of the delayed clocks OCLK1 to OCLK4 after time T510, whereby the first latched signals LMDATA1 to LMDATA4 go "H". As the third latch circuits 583 are controlled by the second latched signals LGATE4 to LGATE7, the third latched signals ODATA1 to ODATA3 are "L" and the third latched signal ODATA4 is "L" in synchronism with the first latched signal LMDATA4. At this point, the output signal ODATA is "L".

As the system clock CLK goes "H" at time T511, the register signals GATE4 to GATE7 are latched by the second latch circuits 584, whereby the second latched signals LGATE5 to LGATE7 remain "H" and the second latched signal LGATE4 remains "L".

As the output data signal MDATA goes "L" at time T511, the output data signal MDATA is latched by the first latch circuits 581 at the rising edges of the delayed clocks OCLK1 to OCLK4 after time T511, whereby the first latched signals LMDATA1 to LMDATA4 go "L". As the third latch circuits 583 are controlled by the second latched signals LGATE4 to LGATE7, the third latched signals ODATA1 to ODATA3 are "L" and the third latched signal ODATA4 goes "H" in synchronism with the first latched signal LMDATA4.

At this point, the output signal ODATA is "H". The output signal ODATA goes "H" at the rising edge of the delayed clock OCLK4, i.e., earlier than the system clock CLK by the time Td.

As the system clock CLK goes "H" at time T512, the register signals GATE4 to GATE7 are latched by the second latch circuits 584, whereby the second latched signals LGATE5 to LGATE7 remain "H" and the second latched signal LGATE4 remains "L".

The output data signal MDATA remains "L" at time T512, and the output data signal MDATA is latched by the first latch circuits 581 at the rising edges of the delayed clocks OCLK1 to OCLK4 after time T512, whereby the first latched signals LMDATA1 to LMDATA4 go "L". As the third latch circuits 583 are controlled by the second latched signals LGATE4 to LGATE7, the third latched signals ODATA1 to ODATA3 are "L" and the third latched signal ODATA4 is "L" in synchronism with the first latched signal LMDATA4.

With such a circuit configuration, the output data signal MDATA can be output as the output signal ODATA at a timing earlier than the system clock CLK by the time Td.

As described above, it is possible to detect the signal propagation time $\Delta T$ from the determination signal output from the timing adjustment interface, and it is possible to generate the output signal clock obtained by delaying the system clock by the amount of time (cycle of system clock–signal propagation time $\Delta T$). In view of this, the signal propagation time between the information processing device and the semiconductor memory device is calculated from the input signal input to the semiconductor memory device so as to output signals at a timing adjusted based on the signal propagation time. Thus, it is possible to receive signals from the semiconductor memory device at a timing associated with the system clock such that the information processing device does not erroneously read the signals, without having to add a circuit for adjusting the timing of signal latching to the information processing device. The precision of the output signal timing adjustment can be improved by increasing the number of delayed clocks.

Although the illustrated example is directed to a case where the timing adjustment interface 102 and the memory core 103 of Embodiment 1 are used, the present invention is not limited to this. For example, the timing adjustment interfaces 202, 302 and 402 of Embodiments 2, 3 and 4 (FIGS. 4, 7 and 10) or the memory core 203 may be used, and the output signal timing adjustment circuit 519 may receive the latch circuit control signal 218, the determination signal 316 or the determination signals 436 to 439, instead of the register signal 119 (the phase difference determination signal).

Moreover, the present invention is not limited to the use of the register signal 119 output from the timing adjustment interface 102, or the like, as described above, but it is possible to ensure that the information processing device 501 can properly receive data by controlling the output timing of the output data signal based on a signal generated according to the delay time of the clock signal and the data signal so as to cancel out the influence of the delay time.

As described above, according to the embodiments of the present invention, it is possible to reliably ensure a sufficient setup time and it is also easily possible to ensure a sufficient hold time by ensuring that the input signal is latched within as small a timing margin as possible (within a predetermined range of timing margin). Thus, it is easily possible to use a high-frequency clock such that the cycle thereof is close to the sum of the setup time and the hold time, for example.

The present invention, which realizes the adjustment of timing between the clock signal and the data signal without performing a dedicated test operation, is useful as, for example, a semiconductor memory device to/from which stored data is input/output in synchronism with a clock signal.

What is claimed is:

1. A semiconductor memory device to/from which a data signal is input/output in synchronism with a clock, comprising:
   an input signal delaying circuit for delaying an input signal to output the delayed input signal;
   a delayed clock generation circuit for delaying an input clock by different amounts of delay time to thereby generate a plurality of delayed clocks;
   a plurality of delayed input signal holding circuits for holding the delayed input signal on the plurality of delayed clocks, respectively;
   an input signal latch timing determination circuit for outputting a determination signal indicating a timing at which to latch the delayed input signal, based on a plurality of held signals held by the delayed input signal holding circuits; and
   a held signal selector circuit for integrating the plurality of held signals into a single signal.

2. The semiconductor memory device of claim 1, further comprising a determination signal holding circuit for holding the determination signal output from the input signal latch timing determination circuit at a predetermined point in time,
   wherein the plurality of delayed input signal holding circuits are controlled based on the determination signal held by the determination signal holding circuit.

3. The semiconductor memory device of claim 2, further comprising a determination/setting signal selector circuit, whereby the determination signal holding circuit selectively holds either the determination signal or a predetermined setting signal.

4. The semiconductor memory device of claim 1, wherein the input signal latch timing determination circuit compares each pair of the plurality of held signals held by the delayed input signal holding circuits, the pair being two signals held on delayed clocks with closest amounts of delay time to each other.

5. The semiconductor memory device of claim 1, further comprising:
   a phase difference detection circuit for detecting a phase difference between the input signal and the clock based on the determination signal output from the input signal latch timing determination circuit; and
   an output signal timing adjustment circuit for adjusting an output timing of the output data signal based on the detected phase difference.

6. A memory system, comprising:
   the semiconductor memory device of claim 5; and
   an information processing device operating on a common clock with the semiconductor memory device for inputting/outputting stored data to/from the semiconductor memory device.

7. A semiconductor memory device to/from which a data signal is input/output in synchronism with a clock, comprising:
   an input signal delaying circuit for delaying an input signal to output the delayed input signal;
   a delayed clock generation circuit for delaying an input clock by different amounts of delay time to thereby generate a plurality of delayed clocks;
   a plurality of delayed input signal holding circuits for holding the delayed input signal on the plurality of delayed clocks, respectively;
   an input signal latch timing determination circuit for outputting a determination signal indicating a timing at which to latch the delayed input signal, based on a plurality of held signals held by the delayed input signal holding circuits at a predetermined point in time; and
   a held signal selector circuit for integrating the plurality of held signals into a single signal,
   wherein the plurality of delayed input signal holding circuits are controlled based on the determination signal.

8. The semiconductor memory device of claim 7, wherein:
   while the held signals being held by the delayed input signal holding circuits are all of the same level, the input signal latch timing determination circuit outputs a determination signal such that all the delayed input signal holding circuits are active; and
   when the held signal being held by any one of the delayed input signal holding circuits is of a different level from those of the other held signals, the input signal latch timing determination circuit outputs a determination signal such that only the one delayed input signal holding circuit is active.

9. The semiconductor memory device of claim 7, further comprising:
   a phase difference detection circuit for detecting a phase difference between the input signal and the clock based on the determination signal output from the input signal latch timing determination circuit; and
   an output signal timing adjustment circuit for adjusting an output timing of the output data signal based on the detected phase difference.

10. A memory system, comprising:
    the semiconductor memory device of claim 9; and
    an information processing device operating on a common clock with the semiconductor memory device for inputting/outputting stored data to/from the semiconductor memory device.

11. A semiconductor memory device to/from which a data signal is input/output in synchronism with a clock, comprising:
    an input signal delaying circuit for delaying an input signal to output the delayed input signal;
    a delayed clock generation circuit for delaying an input clock by different amounts of delay time to thereby generate a plurality of delayed clocks;
    a plurality of first holding circuits for holding the delayed input signal on the plurality of delayed clocks, respectively;
    a plurality of second holding circuits for holding the held signals of the first holding circuits on one of the delayed clocks with a shortest amount of delay time;
    a latch timing determination circuit for generating timing determination signals for controlling transmissions of held signals output from the second holding circuits, based on the plurality of held signals of the first holding circuits, and holding the generated timing determination signals on one of the delayed clocks with a shortest amount of delay time; and
    a held signal selector circuit for controlling transmissions of the plurality of held signals output from the second holding circuits, based on the timing determination signals held by the timing determination circuit, and for integrating the held signals into a single signal.

12. The semiconductor memory device of claim 11, wherein:
    the second holding circuits hold the held signals of the first holding circuits on one of the delayed clocks with a shortest amount of delay time;
    when the held signals of the first holding circuits are all of the same value, the input signal latch timing determination circuit selects the held signal of one of the second holding circuits that holds the held signal held by the first holding circuit on one of the delayed clocks with a shortest amount of delay time; and for each pair of held signals that are held by the first holding circuits on delayed clocks with closest amounts of delay time to each other, the input signal latch timing determination circuit selects the held signal of another second holding circuit based on a comparison between the pair of held signals.

13. The semiconductor memory device of claim 11, further comprising:

a phase difference detection circuit for detecting a phase difference between the input signal and the clock based on the determination signal output from the input signal latch timing determination circuit; and an output signal timing adjustment circuit for adjusting an output timing of the output data signal based on the detected phase difference.

14. A memory system, comprising:

the semiconductor memory device of claim 13; and an information processing device operating on a common clock with the semiconductor memory device for inputting/outputting stored data to/from the semiconductor memory device.

15. A semiconductor memory device to/from which a data signal is input/output in synchronism with a clock, comprising:

an input signal delaying circuit for delaying an input signal to output the delayed input signal;

a double-cycle clock generation circuit for generating, from an input clock, a double-cycle clock having a cycle that is twice as long as that of the input clock;

a double-cycle delayed clock generation circuit for delaying the double-cycle clock by different amounts of delay time to thereby generate a plurality of double-cycle delayed clocks;

a plurality of first holding circuits for holding the delayed input signal at rising edges of the plurality of double-cycle delayed clocks, respectively;

a plurality of second holding circuits for holding the delayed input signal at falling edges of the plurality of double-cycle delayed clocks, respectively;

a plurality of third holding circuits for holding the held signals of the first holding circuits at the rising edges of the plurality of double-cycle delayed clocks, respectively;

a plurality of fourth holding circuits for holding the held signals of the second holding circuits at the falling edges of the plurality of double-cycle delayed clocks, respectively;

a first input signal latch timing determination circuit for generating first timing determination signals based on the plurality of held signals held by the first holding circuits, and holding the generated first timing determination signals at the rising edge of one of the double-cycle delayed clocks with a shortest amount of delay time;

a second input signal latch timing determination circuit for generating second timing determination signals based on the plurality of held signals held by the second holding circuits, and holding the generated second timing determination signals at the falling edge of one of the double-cycle delayed clocks with a shortest amount of delay time;

a first signal logical value determination circuit for outputting a first logical value determination signal based on whether the first timing determination signals held by the first input signal latch timing determination circuit are all of the same value;

a second signal logical value determination circuit for outputting a second logical value determination signal based on whether the second timing determination signals held by the second input signal latch timing determination circuit are all of the same value;

a plurality of first held signal transmission control circuits for controlling transmissions of the held signals output from the third holding circuits, based on the first timing determination signals held by the first input signal latch timing determination circuit and the first logical value determination signal;

a plurality of second held signal transmission control circuits for controlling transmissions of the held signals output from the fourth holding circuits, based on the second timing determination signals held by the second input signal latch timing determination circuit and the second logical value determination signal;

a plurality of fifth holding circuits for holding signals output from the first held signal transmission control circuit at the rising edge of one of the double-cycle delayed clocks with a shortest amount of delay time;

a plurality of sixth holding circuits for holding signals output from the second held signal transmission control circuit at the falling edge of one of the double-cycle delayed clocks with a shortest amount of delay time;

a plurality of held signals selector circuits for selecting either the held signals output from the fifth holding circuits or the held signals output from the sixth holding circuits, based on the plurality of double-cycle delayed clocks; and a selection signal selector circuit for integrating the signals output from the plurality of selector circuits into a single signal.

16. The semiconductor memory device of claim 15 wherein:

the first input signal latch timing determination circuit compares each pair of the plurality of held signals held by the first holding circuits to generate the first timing determination signal, the pair being two signals held on double-cycle delayed clocks with closest amounts of delay time to each other;

the second input signal latch timing determination circuit compares each pair of the plurality of held signals held by the second holding circuits to generate the second timing determination signal, the pair being two signals held on double-cycle delayed clocks with closest amounts of delay time to each other;

one of the plurality of first held signal transmission control circuits for controlling the transmission of the signal that is held by the first holding circuit on one of the double-cycle delayed clocks with a shortest amount of delay time and that is further held by the third holding circuit is controlled based on the first logical value determination signal, whereas the other first held signal transmission control circuits are controlled by the first timing determination signals; and one of the plurality of second held signal transmission control circuits for controlling the transmission of the signal that is held by the second holding circuit on one of the double-cycle delayed clocks with a shortest amount of delay time and that is further held by the fourth holding circuit is controlled based on the second logical value determination signal, whereas the other second held signal transmission control circuits are controlled by the second timing determination signal.

17. The semiconductor memory device of claim 15, further comprising:
a determination signal selector circuit for selecting, based on the double-cycle delayed clocks, either:
the first timing determination signal output from the first input signal latch timing determination circuit and the first logical value determination signal; or
the second timing determination signal output from the second input signal latch timing determination circuit and the second logical value determination signal;
a phase difference detection circuit for detecting a phase difference between the input signal and the clock based on the signals output from the determination signal selector circuit; and
an output signal timing adjustment circuit for adjusting an output timing of the output data signal based on the detected phase difference.

18. A memory system, comprising:
the semiconductor memory device of claim 17; and
an information processing device operating on a common clock with the semiconductor memory device for inputting/outputting stored data to/from the semiconductor memory device.

* * * * *